(12) United States Patent
Kinjo et al.

(10) Patent No.: US 8,189,171 B2
(45) Date of Patent: May 29, 2012

(54) PLOTTING STATE ADJUSTING METHOD AND DEVICE

(75) Inventors: Naoto Kinjo, Kanagawa-ken (JP); Katsuto Sumi, Minami-ashigara (JP); Ryo Kitano, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 816 days.

(21) Appl. No.: 12/293,822

(22) PCT Filed: Mar. 16, 2007

(86) PCT No.: PCT/JP2007/055441
§ 371 (c)(1),
(2), (4) Date: Sep. 21, 2008

(87) PCT Pub. No.: WO2007/111173
PCT Pub. Date: Oct. 4, 2007

(65) Prior Publication Data
US 2010/0231985 A1    Sep. 16, 2010

(30) Foreign Application Priority Data
Mar. 27, 2006  (JP) .................................. 2006-085145

(51) Int. Cl.
*G03B 27/52* (2006.01)
*G03B 27/54* (2006.01)
(52) U.S. Cl. .......................................... 355/55; 355/67
(58) Field of Classification Search .................... 355/55, 355/67
See application file for complete search history.

(56) References Cited

U.S. PATENT DOCUMENTS

| 7,068,414 B2 | 6/2006 | Sunagawa et al. |
| 2005/0001895 A1* | 1/2005 | Uemura et al. ............... 347/235 |
| 2005/0286093 A1 | 12/2005 | Sumi et al. |

FOREIGN PATENT DOCUMENTS

| JP | 2001-500628 A | 1/2001 |
| JP | 2004-062155 A | 2/2004 |
| JP | 2004-226520 A | 8/2004 |
| JP | 2005-031232 A | 2/2005 |
| JP | 2006-030986 A | 2/2006 |
| JP | 2006-085074 A | 3/2006 |
| JP | 2006-245556 A | 9/2006 |
| JP | 2006-337601 A | 12/2006 |
| JP | 2007-025398 A | 2/2007 |

OTHER PUBLICATIONS

International Search Report, mailed May 29, 2007, in corresponding Intern'l Application No. PCT/JP2007/055441, 4 pages in English and Japanese.
Written Opinion, mailed May 29, 2007, in corresponding Intern'l Application No. PCT/JP2007/055441, 3 pages in Japanese.

* cited by examiner

*Primary Examiner* — Peter B Kim
(74) *Attorney, Agent, or Firm* — Sughrue Mion, PLLC

(57) ABSTRACT

It is possible to set an optical magnification capable of making a recording position shift amount with respect to Y direction of the plotting point formed by a micro mirror within an allowance range from the relationship between a Y-direction distance between mirror images obtained by projecting micro mirrors constituting a DMD onto a substrate, an inclination angle of the DMD, an image pattern recording pitch, and an optical magnification.

7 Claims, 24 Drawing Sheets

PLOTTING STATE ADJUSTING METHOD AND DEVICE

TECHNICAL FIELD

The present invention relates to a recording (plotting) state adjusting method and device in an image recording apparatus for relatively moving a plurality of recording elements arrayed in a two-dimensional array in a predetermined scanning direction along a recording surface and controlling the recording elements according to recording data to record an image on the recording surface.

BACKGROUND ART

Heretofore, there have been proposed various exposure apparatus, as an example of recording apparatus, having a spatial light modulator such as a digital micromirror device (DMD) or the like for exposing a recording medium to an image with a light beam modulated with image data. The DMD is a mirror device comprising a number of micromirrors for changing the angles of their reflecting surfaces depending on control signals based on image data, the micromirrors being arranged in a two-dimensional array on a semiconductor substrate such as of silicon or the like. An exposure head with such a DMD is relatively moved in a scanning direction over a recording medium to record a two-dimensional image thereon by way of exposure.

In order to increase the resolution of the image recorded on the recording medium, there has been proposed an exposure apparatus in which a DMD comprising a two-dimensional matrix of micromirrors is inclined to the scanning direction, so that the exposed points formed on the recording medium by closely located micromirrors partially overlap each other (see Japanese Laid-Open Patent Publication No. 2001-500628 (PCT)). When a plurality of exposed points are overlappingly formed on the recording medium by way of multiple exposure, it is possible to reduce an image quality degradation which tends to be caused by a defect of an optical system such as microlenses corresponding to the micromirrors, a defect of the micromirrors themselves, or an amount-of-light irregularity of light beams reflected by the micromirrors to the recording medium.

DISCLOSURE OF THE INVENTION

When multiple exposure is performed by the inclined DMD, if the direction of the array of exposed points formed on the recording medium by closely located micromirrors is close to the direction of an image pattern to be recorded on the recording medium, then jaggies tend to be produced on the image pattern, which results in image degradation.

The above problem is not limited to the exposure apparatus with the DMD, but also occurs in an ink jet printer or the like for ejecting ink droplets to the recording surface of a recording medium to record an image thereon.

It is a general object of the present invention to provide a recording state adjusting method and device for reliably reducing jaggies produced on an image pattern when the image pattern is recorded on a recording medium by a plurality of image recording elements that are disposed in a two-dimensional array.

A main object of the present invention is to provide a recording state adjusting method and device for lowering the visibility of jaggies produced by the interference between an arrayed pattern of image recording elements and an image pattern to be recorded.

BEST MODE FOR CARRYING OUT THE INVENTION

Figure 1:
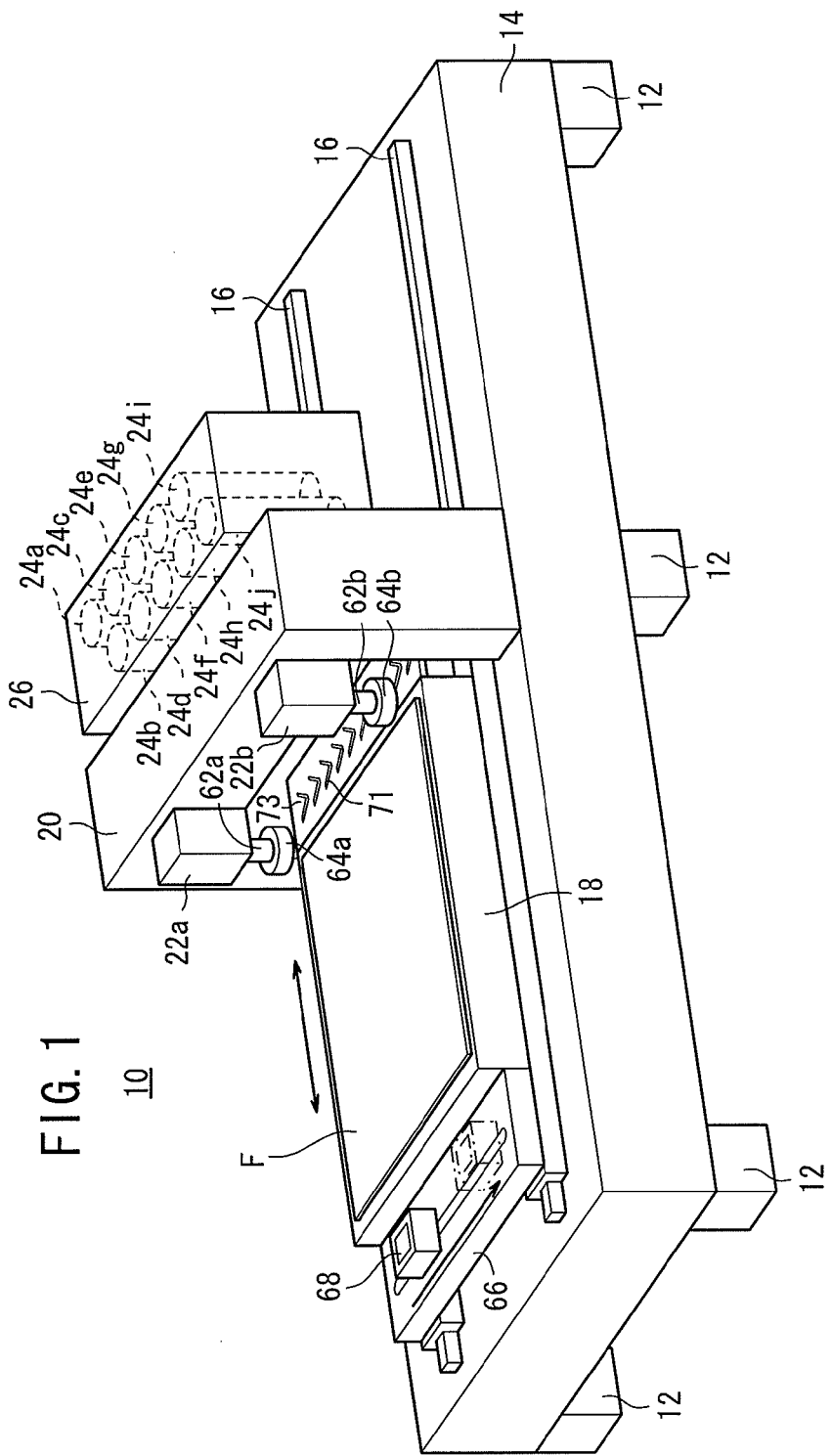
FIG. 1 is a perspective view of an exposure apparatus according to an embodiment of the present invention.

FIG. 1 shows an exposure apparatus 10 of the flat-bed type as a recording device to which a recording state adjusting method and device according to the present invention is applied. The exposure apparatus 10 has a bed 14 supported by a plurality of legs and which hardly deforms and an exposure stage 18 mounted on the bed 14 by two guide rails 16 for reciprocal movement therealong in the directions indicated by the arrow. A substrate F coated with a photosensitive material is attracted to and held by the exposure stage 18.

A portal-shaped column 20 is disposed centrally on the bed 14 over the guide rails 16. CCD cameras 22a, 22b are fixedly mounted on one side of the column 20 for detecting the position where the substrate F is mounted on the exposure stage 18. A plurality of exposure heads 24a through 24j for recording an image on the substrate F through exposure are positioned in and held by a scanner 26 that is fixedly mounted on the other side of the column 20. The exposure heads 24a through 24j are arranged in a staggered pattern in two rows extending in a direction perpendicular to the scanning direction of the substrate F (the moving direction of the exposure stage 18). Flash lamps 64a, 64b are mounted on the CCD cameras 22a, 22b, respectively, by respective rod lenses 62a, 62b. The flash lamps 64a, 64b apply an infrared radiation to which the substrate F is insensitive, as illuminating light, to respective image capturing areas for the CCD cameras 22a, 22b.

A guide table 66 which extends in the direction perpendicular to the directions in which the exposure stage 18 is movable is mounted on an end of the bed 14. The guide table 66 supports thereon a photosensor 68 movable in an X direction for detecting the amount of light of laser beams L emitted from the exposure heads 24a through 24j.

Figure 2:
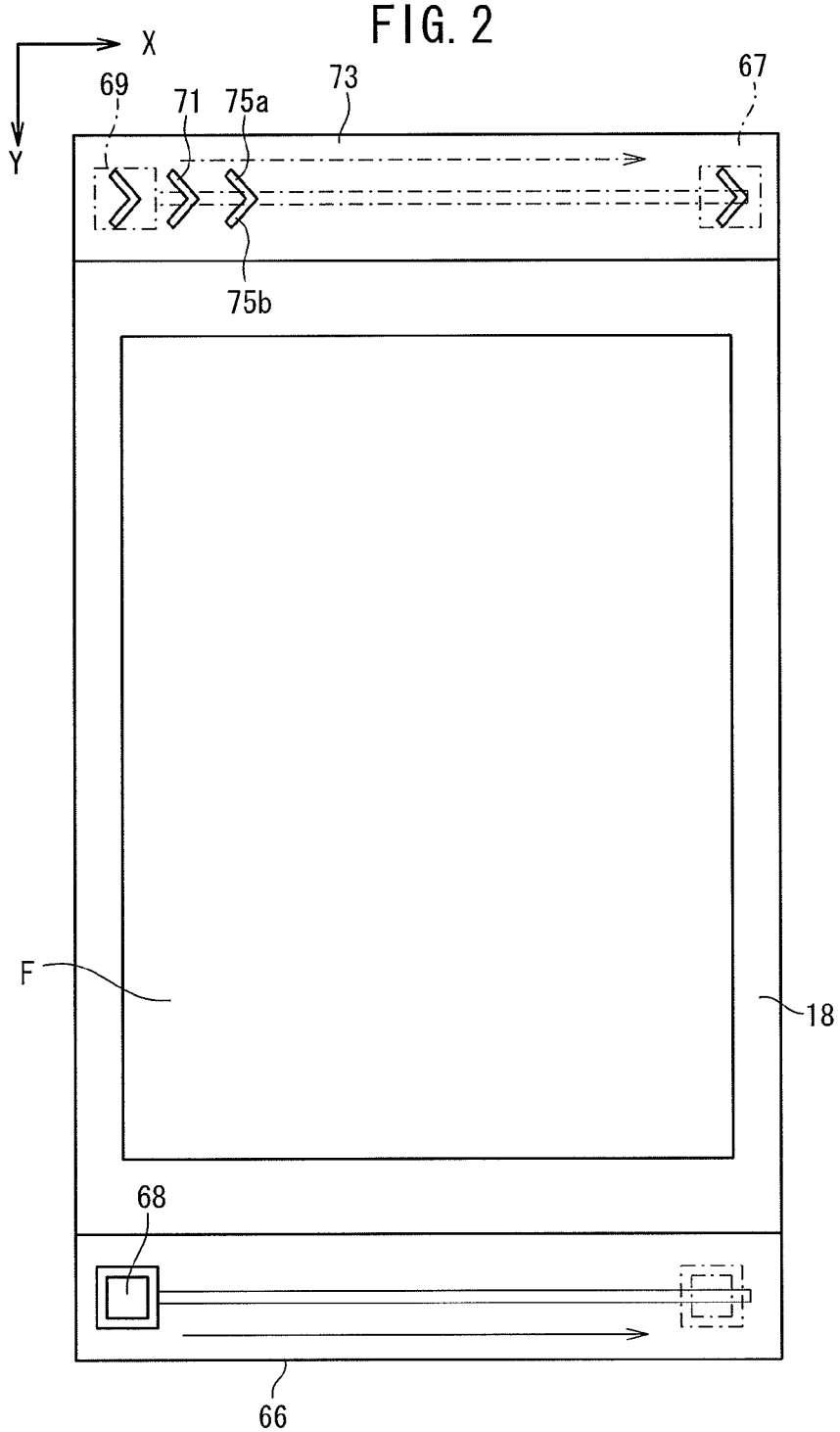
FIG. 2 is a plan view of an exposure stage of the exposure apparatus according to the embodiment.

As shown in FIG. 2, a photosensor 69 movable in the X direction along a guide table 67 is disposed on the other end of the bed 14. A slit plate 73 having a plurality of slits 71 arrayed in the X direction is mounted above the photosensor 69. Each of the slits 71 is of a V shape including two slit sections 75a, 75b inclined at an angle of 45° to the moving direction (Y direction) of the exposure stage 18. The photosensor 69 detects the laser beams L that have passed through the slit sections 75a, 75b to calculate inclined angles of spatial optical modulators incorporated in the exposure heads 24a through 24j. The exposure heads 24a through 24j are rotatable about the axes of the laser beams L for adjusting the inclined angles referred to above.

Figure 3:
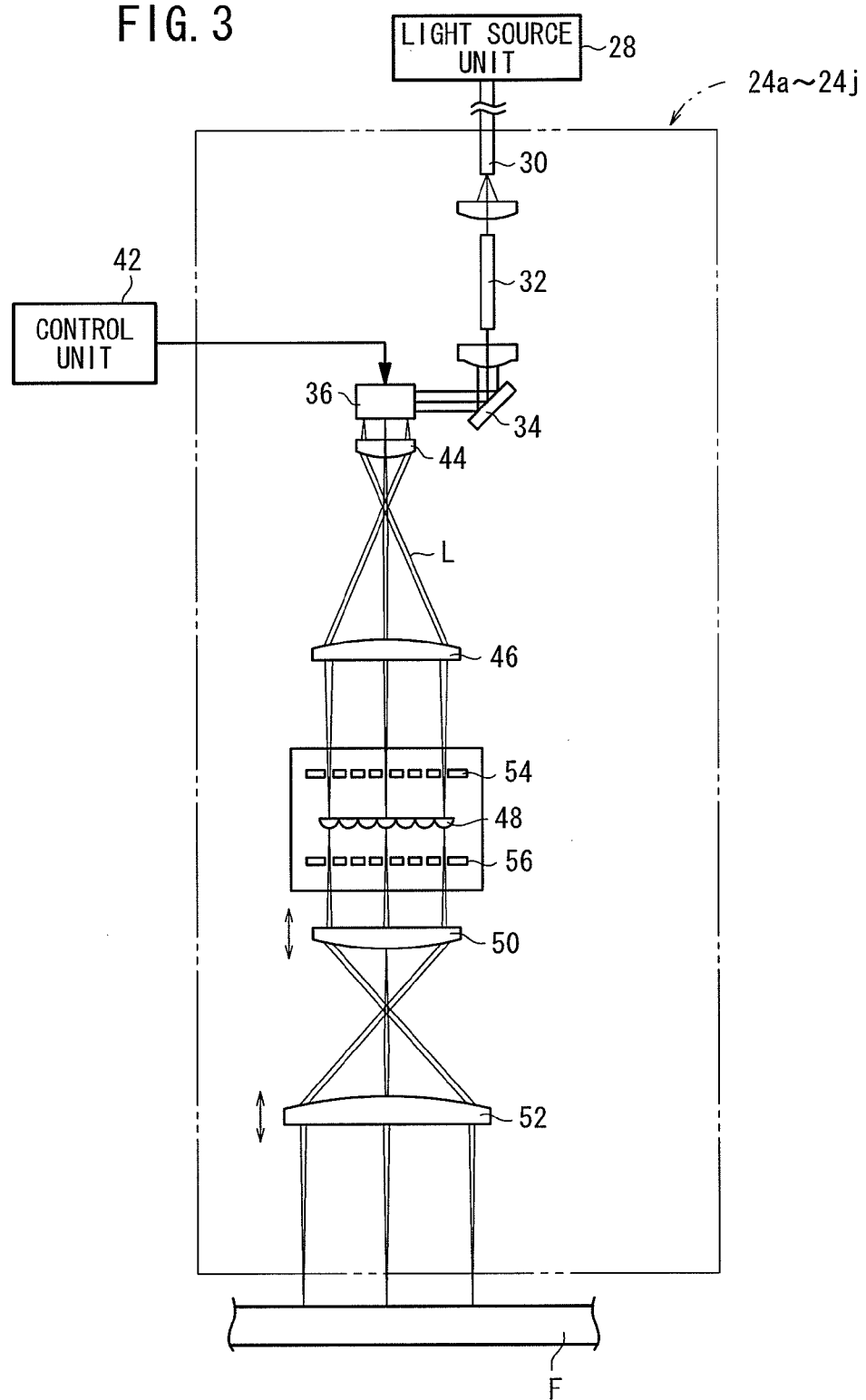
FIG. 3 is a schematic view of an exposure head of the exposure apparatus according to the embodiment.

FIG. 3 shows a structure of each of the exposure heads 24a through 24j. A combined laser beam L emitted from a plurality of semiconductor lasers of a light source unit 28 is introduced through an optical fiber 30 into each of the exposure heads 24a through 24j. A rod lens 32, a reflecting mirror 34, and a digital micromirror device (DMD) 36 (spatial optical modulator) are successively arranged on an exit end of the optical fiber 30 into which the laser beam L is introduced.

Figure 4:
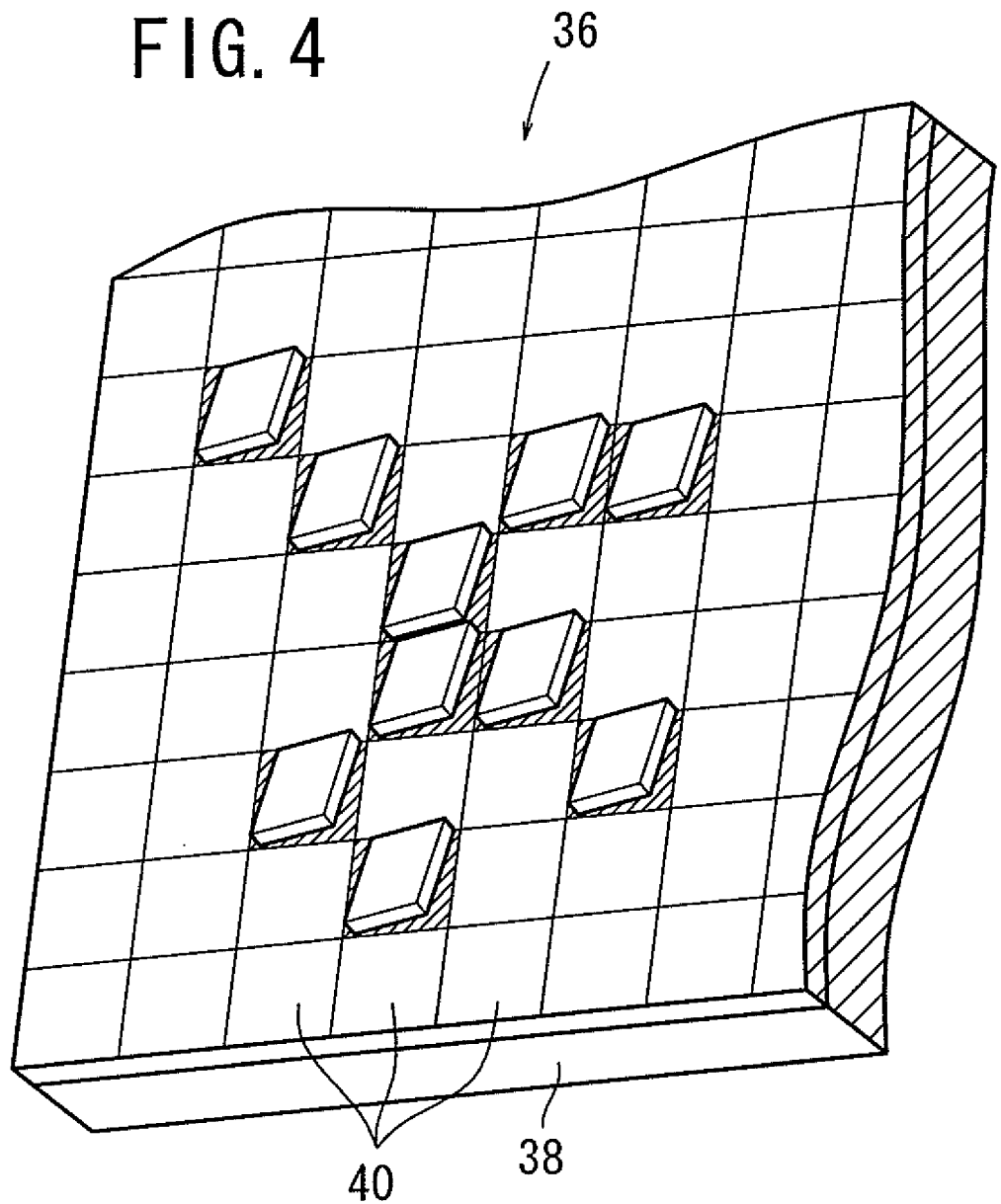
FIG. 4 is an enlarged fragmentary view showing a digital micromirror device (DMD) employed in the exposure head of the exposure apparatus according to the embodiment.
Figure 5:
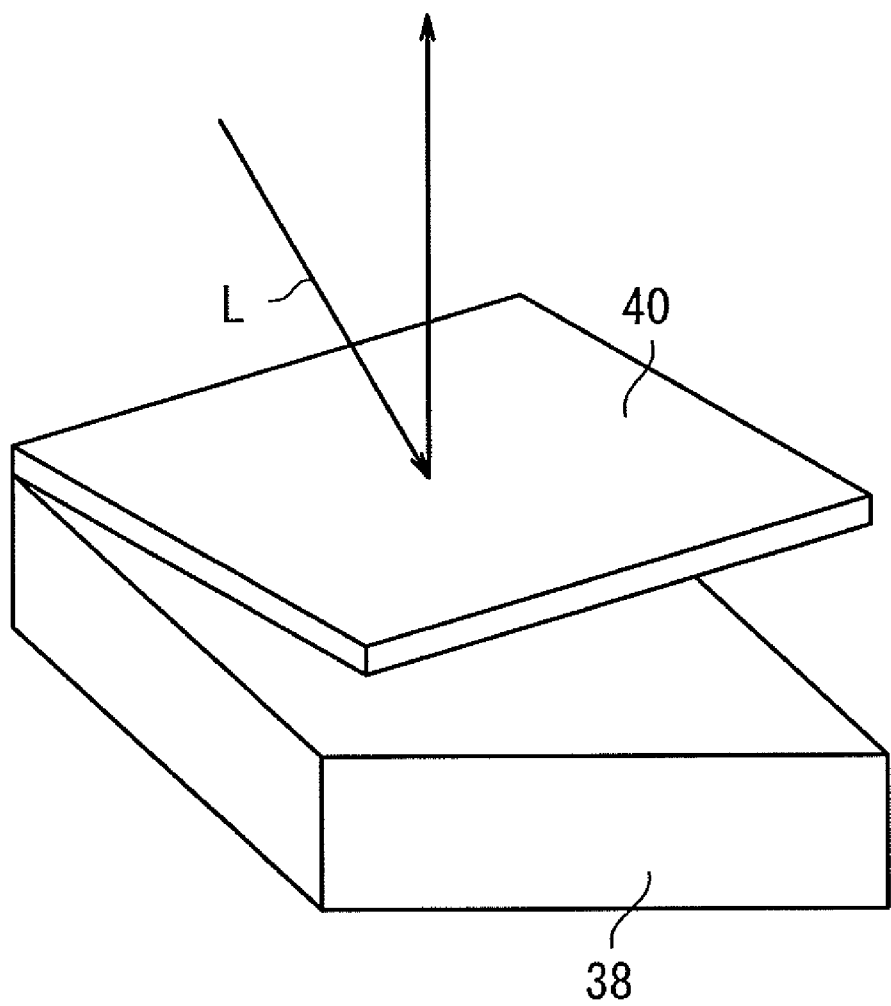
FIG. 5 is a view showing the manner in which a micromirror of the DMD shown in FIG. 4 is set to an on-state.
Figure 6:
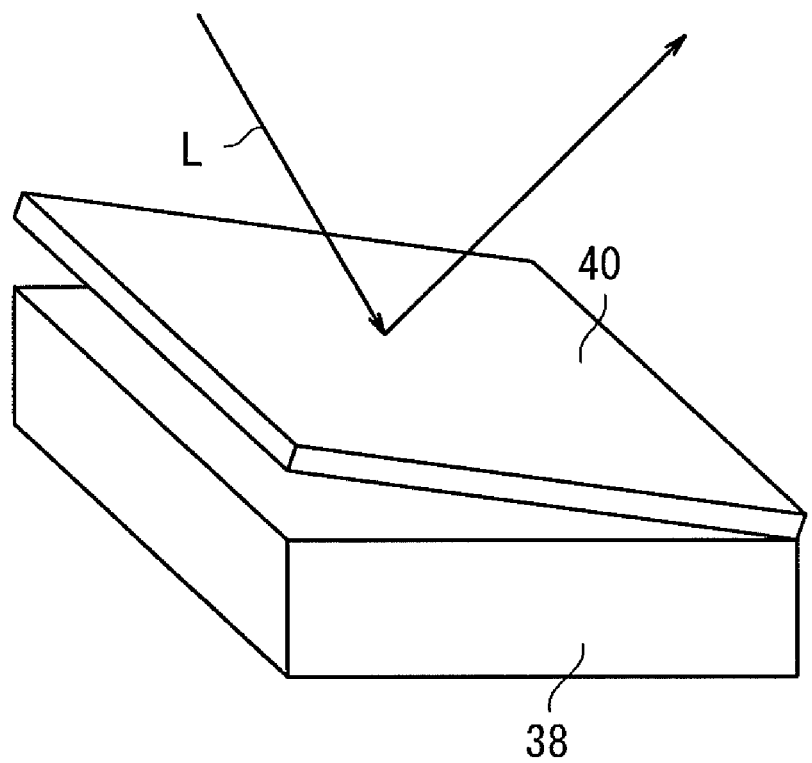
FIG. 6 is a view showing the manner in which the micromirror of the DMD shown in FIG. 4 is set to an off-state.

As shown in FIG. 4, the DMD 36 comprises a number of micromirrors 40 that are swingably disposed in a matrix pattern on SRAM cells (memory cells) 38. A material having a high reflectance such as aluminum or the like is evaporated on the surface of each of the micromirrors 40. When a digital signal according to image recording data is written in the SRAM cells 38, as shown in FIGS. 5 and 6, the micromirrors 40 are tilted in given directions about diagonal lines thereof depending on the state of the applied digital signal. FIG. 5 shows the manner in which the micromirror 40 is tilted to an on-state, and FIG. 6 shows the manner in which the micromirror 40 tilted to an off-state. When the tilt of the micromirrors 40 of the DMD 36 is controlled according to a modulated signal based on the image recording data supplied from a control unit 42, the micromirrors 40 selectively guide the laser beams L to the substrate F depending on the image recording data, for thereby recording a desired image pattern on the substrate F.

In the direction in which the laser beam L reflected by the micromirrors 40 that are inclined to the on-state is emitted, there are successively disposed first image focusing optical lenses 44, 46 as a magnifying optical system, a microlens array 48 having many lenses corresponding to the respective micromirrors 40 of the DMD 36, and second image focusing optical lenses 50, 52 as a magnification adjusting optical system. The second image focusing optical lenses 50, 52 are movable in the directions indicated by the arrows for adjusting their optical magnification. Microaperture arrays 54, 56 for removing stray light and adjusting the laser beam L to a predetermined diameter are disposed in front of and behind the microlens array 48.

Figure 7:
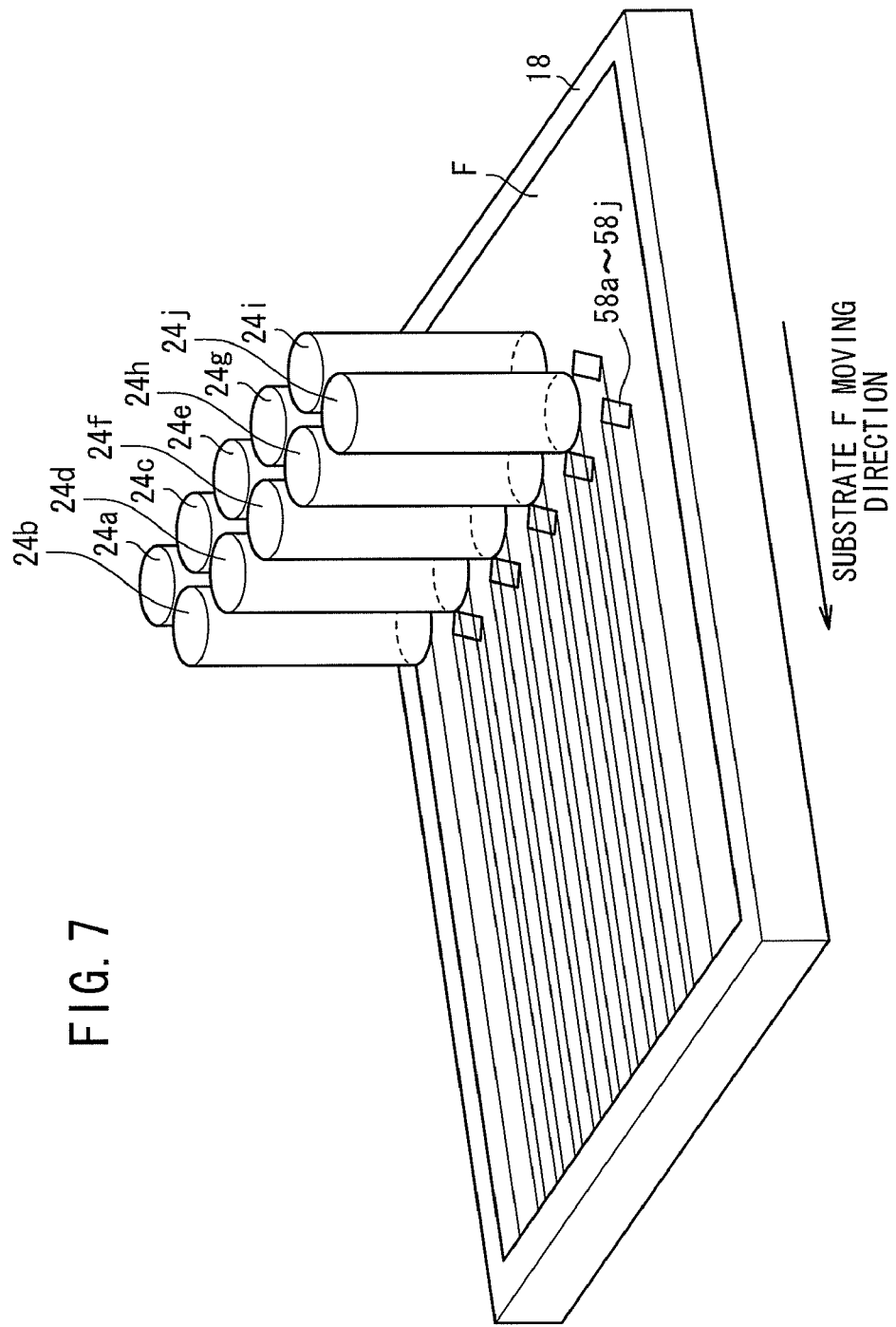
FIG. 7 is a view showing the relationship between the exposure head of the exposure apparatus according to the embodiment and a substrate positioned on the exposure stage.
Figure 8:
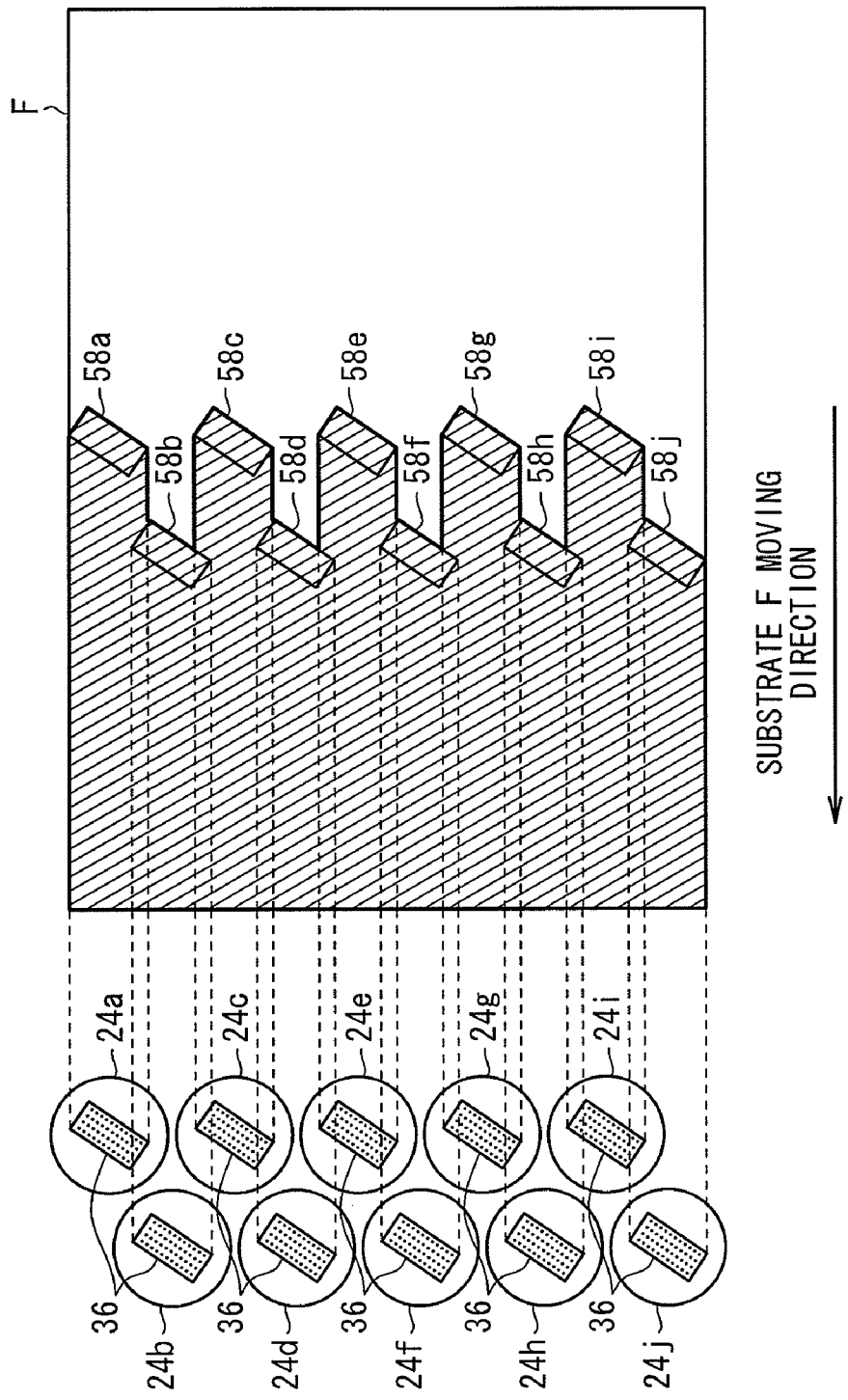
FIG. 8 is a view showing the relationship between the exposure head of the exposure apparatus according to the embodiment and an exposure area on the substrate.

As shown in FIGS. 7 and 8, the DMDs 36 incorporated in the respective exposure heads 24a through 24j are inclined a predetermined angle to the direction in which the substrate F moves, for achieving higher resolution. Specifically, as shown in FIG. 9, the DMDs 36 that are inclined to the scanning direction (Y direction) reduce the interval ΔX between the micromirrors 40 in the direction (X direction) perpendicular to the scanning direction of the micromirrors 40, thereby increasing the resolution with respect to the X direction.

Figure 9:
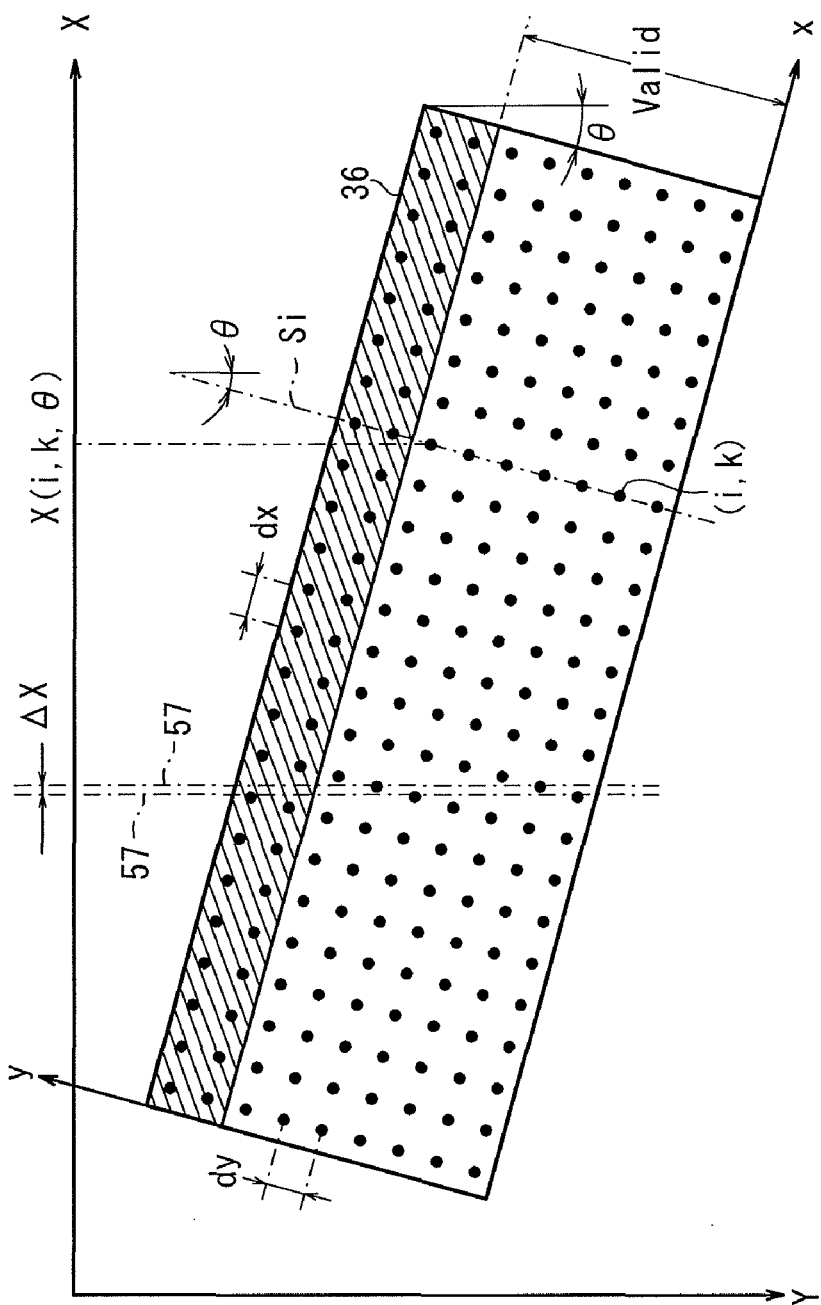
FIG. 9 is a view showing the layout of the micromirrors of the DMD shown in FIG. 4.

In FIG. 9, a plurality of micromirrors 40 (two or three micromirrors 40 in FIG. 9) are disposed on or near one scanning line 57 in the scanning direction (Y direction). The substrate F is exposed to a multiplicity of image patterns by laser beams L that are guided to substantially the same position by these micromirrors 40. In this manner, an image quality degradation due to a defect of the microlens array 48 corresponding to the micromirrors 40, a defect of the micromirrors 40 themselves, or an amount-of-light irregularity of the laser beams L guided by the micromirrors 40 to the substrate F is reduced. To make the exposure heads 24a through 24j seamless, they are arranged such that exposure areas 58a through 58j exposed by the respective exposure heads 24a through 24j overlap in the direction perpendicular to the scanning direction (see FIG. 8).

Figure 10:
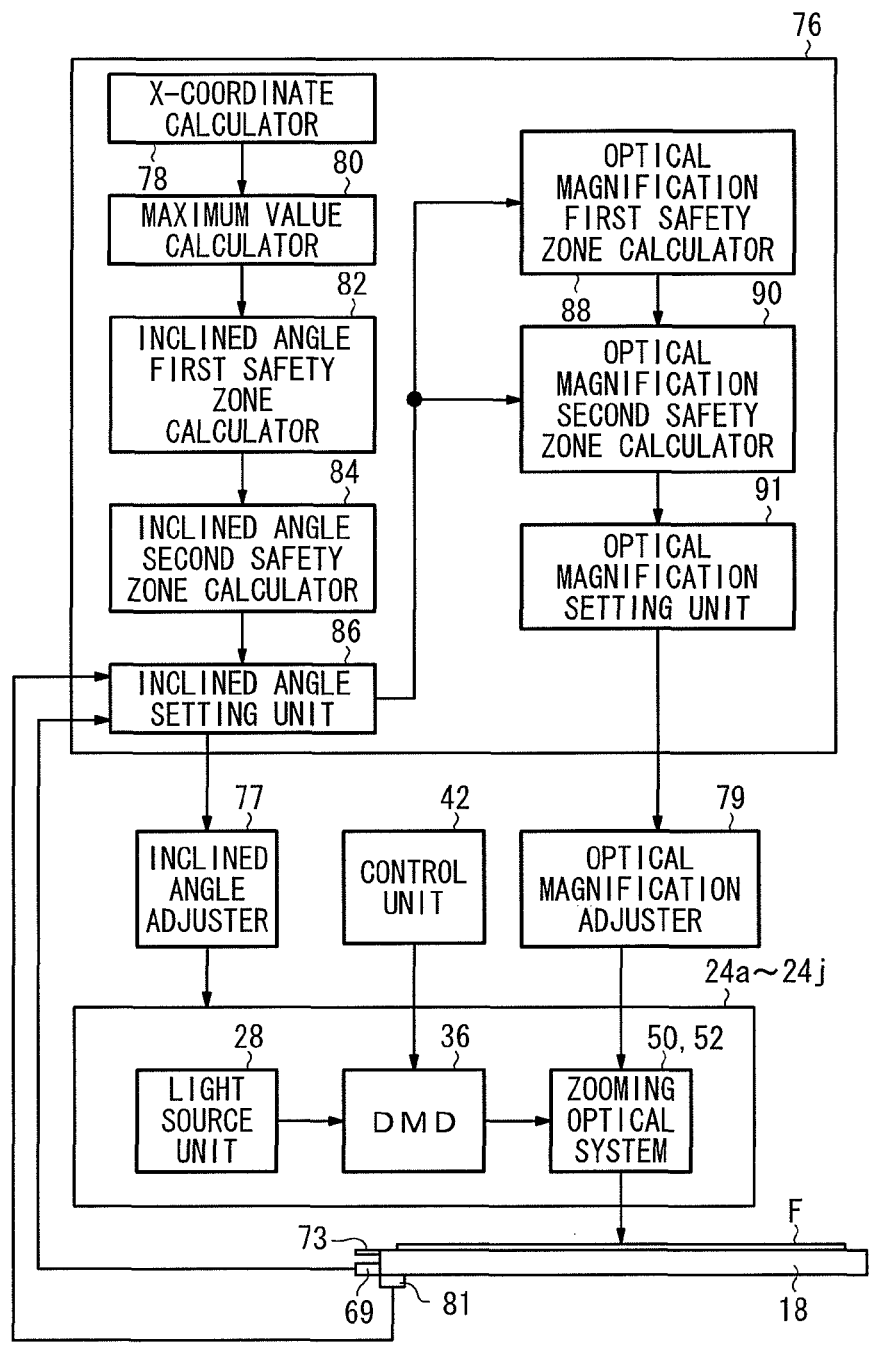
FIG. 10 is a block diagram of a control circuit of the exposure apparatus according to the embodiment.

FIG. 10 is a block diagram of essential components of a processing circuit of the exposure apparatus 10. The processing circuit includes a processor 76 for calculating an appropriate inclined angle θ of the DMD 36 with respect to the Y direction shown in FIG. 9 and an appropriate optical magnification β of the second image focusing optical lenses 50, 52 as a zooming optical system in order to expose the substrate F to a desired image. The processor 76 may be incorporated in an external processing apparatus which is connected to the exposure apparatus 10 for calculating the inclined angle θ and the optical magnification β. The processing circuit also includes an inclined angle adjuster 77 for rotating the exposure heads 24a through 24j according to the inclined angle θ calculated by the processor 76 to adjust the DMD 36 to the inclined angle θ, and an optical magnification adjuster 79 for adjusting the optical magnification β by displacing the second image focusing optical lenses 50, 52 as the zooming optical system according to the optical magnification β calculated by the processor 76.

The processor 76 comprises an X-coordinate calculator 78 for calculating the X coordinate, which is a coordinate in the X direction, of the center of the mirror image, which is projected onto the substrate F, of each of the micromirrors 40 of the DMD 36, and a maximum value calculator 80 for sorting the X coordinates of the mirror images of the DMD 36 in ascending order and calculating the maximum value of the distances between adjacent ones of the X coordinates for each value of the inclined angle θ.

The processor 76 also comprises an inclined angle first safety zone calculator 82 for calculating a first safety zone for allowable inclined angles θ by comparing the maximum value calculated by the maximum value calculator 80 with an allowable upper limit value for a line width variation range of the image pattern recorded on the substrate F with respect to the X direction, an inclined angle second safety zone calculator 84 for performing a simulation in the range of the first safety zone and calculating a second safety zone for allowable inclined angles θ by comparing the line width variation range in the X direction of the image pattern recorded on the substrate F with the allowable upper limit value, and an inclined angle setting unit 86 for calculating the inclined angles θi of respective swaths Si, which represent columns of micromirrors 40 arrayed in the Y direction in FIG. 9, by detecting the laser beams L guided from the respective micromirrors 40 through the slit plate 73 with the photosensor 69 and also by detecting the positional information in the Y direction of the exposure stage 18 with an encoder 81, and setting an inclined angle θ within a range which allows a fluctuation interval of the above inclined angles θi. The inclined angle θ that is set is supplied to the inclined angle adjuster 77.

The processor 76 further comprises an optical magnification first safety zone calculator 88 for calculating an optical magnification βt1 at which jaggies, that are representative of deviations in the Y direction of the image pattern, produced due to the recording positional relationship in the Y direction of recording points which are recorded on the substrate F by adjacent micromirrors 40 of the same swath Si, are maximum at the inclined angle θ set by the inclined angle setting unit 86, and calculating a first safety zone for allowable optical magnifications avoiding values in the vicinity of the optical magnification βt1, an optical magnification second safety zone calculator 90 for calculating an optical magnification βt2 at which jaggies in the Y direction of the image, produced due to the recording positional relationship in the Y direction of recording points which are recorded by way of multiple exposure on the substrate F by micromirrors 40 of different swaths Si, are maximum at the inclined angle θ set by the inclined angle setting unit 86 and in the range of the first safety zone, and calculating a second safety zone for allowable optical magnifications avoiding values in the vicinity of the optical magnification βt2, and an optical magnification setting unit 91 for setting an optical magnification β in the second safety zone. The optical magnification β set in the second safety zone is supplied to the optical magnification adjuster 79.

Figure 11:
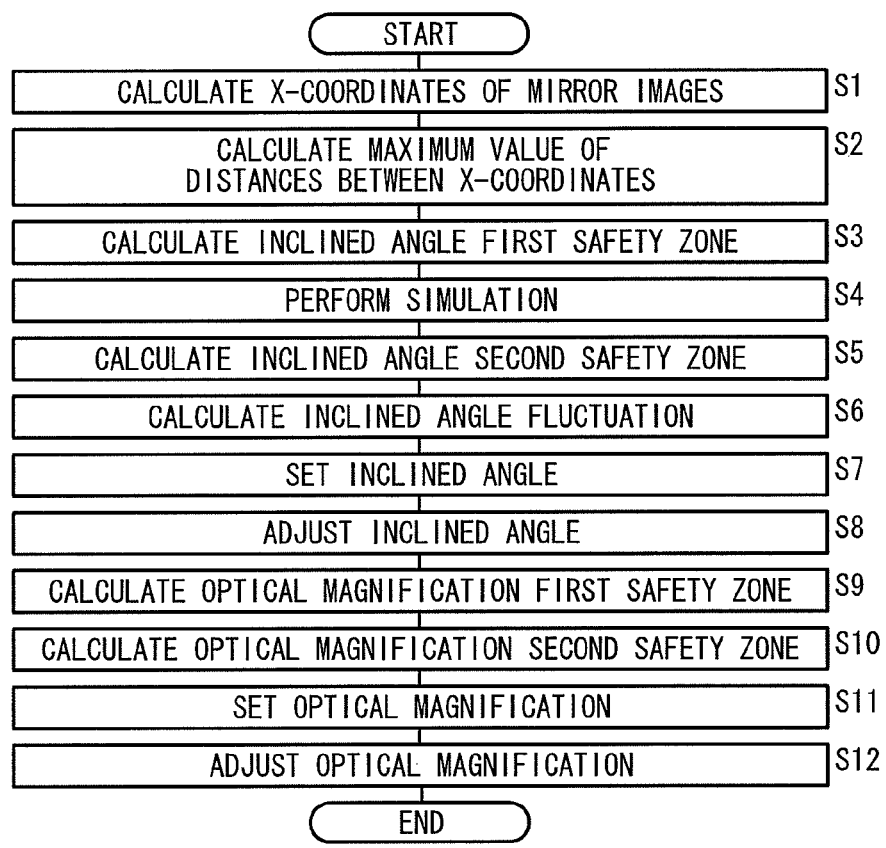
FIG. 11 is a flowchart of a process of adjusting a recorded state in the exposure apparatus according to the embodiment.

The exposure apparatus 10 according to the present embodiment is basically constructed as described above. A method of adjusting the exposure apparatus 10 will be described below with reference to a flowchart shown in FIG. 11.

Figure 12:
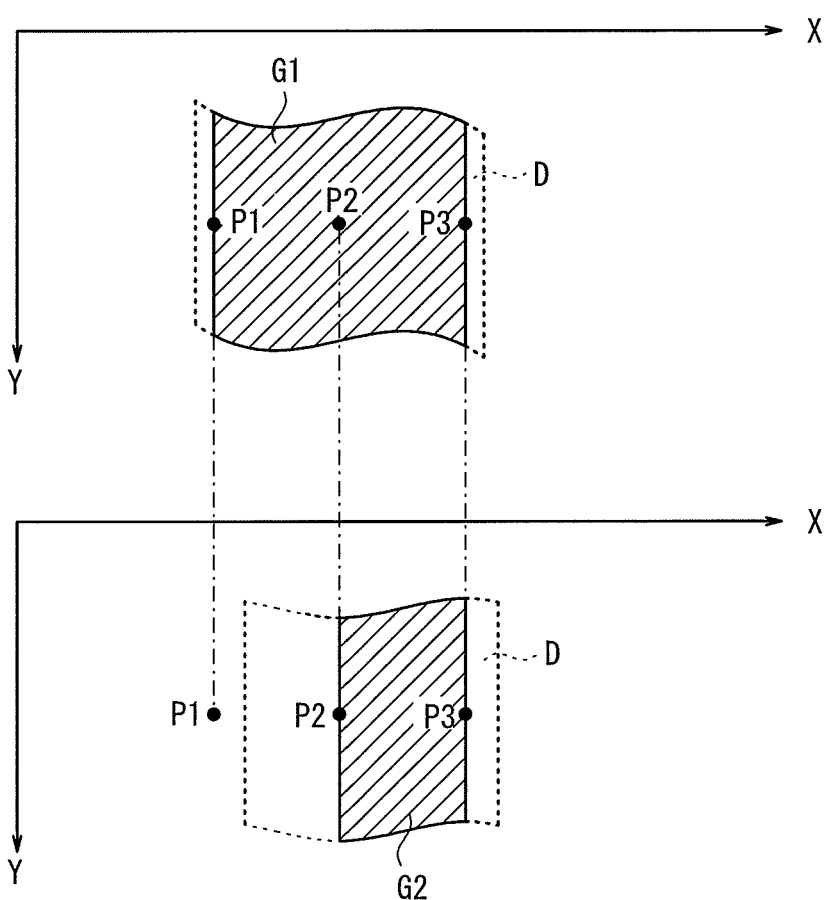
FIG. 12 is a diagram showing line width variations produced when a straight line extending in a scanning direction is recorded by the exposure apparatus according to the embodiment.

When a straight line extending in the Y direction is recorded on the substrate F using a plurality of micromirrors 40, the line width in the X direction varies depending on the recorded position of the straight line in the X direction. For example, as shown in FIG. 12, it is assumed that an image pattern is recorded using image data D having the same line width in the X direction. If the image pattern is recorded at different positions in the X direction with respect to the positions of the micromirrors 40 of the DMD 36, then an image pattern G1 is formed according to mirror images P1 through P3, indicated by solid dots, of micromirrors 40 on the substrate F, whereas an image pattern G2 is formed according to the mirror images P2, P3 which are different in number from the mirror images used to form the image pattern G1, thereby generating line width variations between the image patterns G1, G2. For holding such line width variations within an allowable range, it is necessary to adjust the inclined angle θ of the DMD 36 to adjust the intervals between the mirror images P1 through P3 in the X direction.

First, the X-coordinate calculator 78 calculates X coordinates $X(i, k, \theta)$ at which the centers of the mirror images of all the micromirrors 40 are projected onto the X-axis, for each value of the inclined angle θ of the DMD 36, using the interval dx in the x direction and the interval dy in the y direction between the micromirrors 40 of the DMD 36, and an optical magnification β0 which represent a design ratio between the micromirrors 40 and the mirror images on the substrate F (step S1). The X coordinates $X(i, k, \theta)$ represent coordinates on the X-axis at the inclined angle θ, where i indicates the positions of the micromirrors 40 in the x direction and k the positions of the micromirrors 40 in the y direction.

Figure 13:
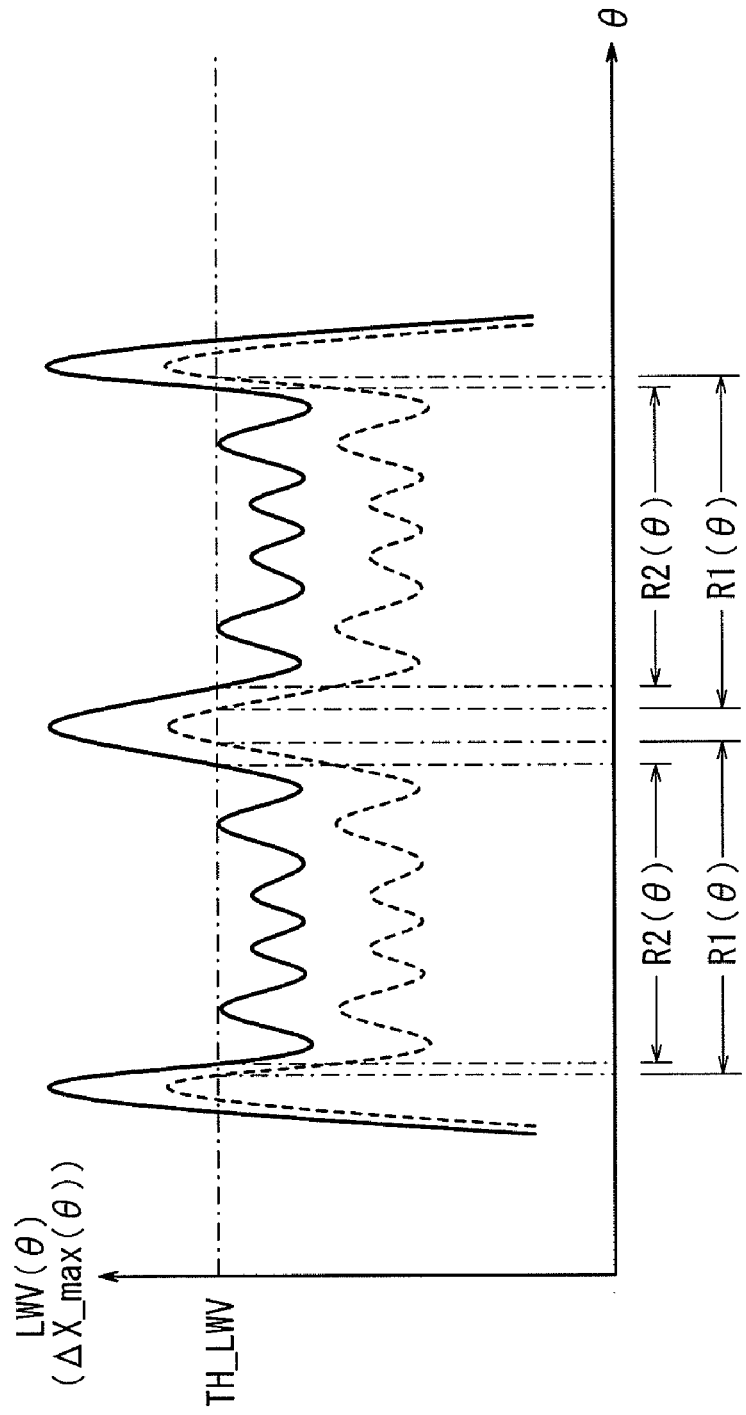
FIG. 13 is a conceptual characteristic diagram showing the relationship between the inclined angle of the DMD and the line width variations in the exposure apparatus according to the embodiment.

Then, the maximum value calculator 80 sorts the X coordinates $X(i, k, \theta)$ in ascending order for each value of the inclined angle θ, and calculates the maximum value $\Delta X\_max(\theta)$ of the distances between adjacent ones of the X coordinates $X(i, k, \theta)$ for each value of the inclined angle θ of the DMD 36 (step S2). The maximum value $\Delta X\_max(\theta)$ can be determined with a very small amount of calculations. A graph indicated by the broken lines in FIG. 13 represents a conceptual characteristic curve plotted with respect to a horizontal axis representative of the inclined angle θ and a vertical axis representative of the maximum value $\Delta X\_max(\theta)$. The conceptual characteristic curve shows a pattern whose maximum value $\Delta X\_max(\theta)$ repeatedly varies between local maximum and minimum values depending on the inclined angle θ, with the local maximum value increasing in particular regions.

Then, the inclined angle first safety zone calculator 82 calculates a first safety zone $R1(\theta)$ for allowable inclined angles θ that are equal to or lower than a threshold value TH_LWV by comparing the calculated maximum value $\Delta X\_max(\theta)$ with the threshold value TH_LWV which is an allowable upper limit value for a line width variation range of the image recorded on the substrate F with respect to the X direction (step S3). The first safety zone $R1(\theta)$ represents a range in which changes in the maximum value $\Delta X\_max(\theta)$ are small and the inclined angles θ are successive, and which satisfies the condition: $\Delta X\_max(\theta) \leq TH\_LWV$.

Figure 14:
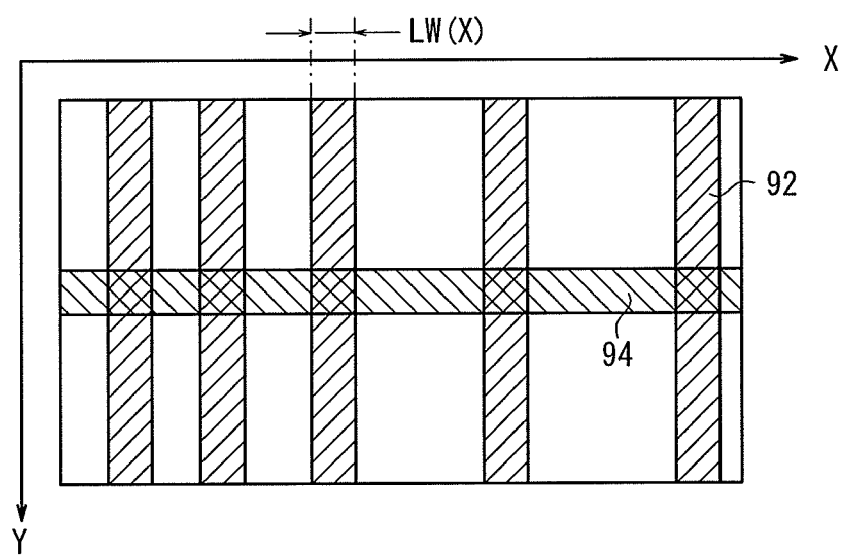
FIG. 14 is a diagram showing image data for determining line width variations by way of simulation.

After the first safety zone $R1(\theta)$ is set, the inclined angle second safety zone calculator 84 performs a simulation in the range of the first safety zone $R1(\theta)$ and calculates a line width variation range $LWV(\theta)$ (step S4). For example, the inclined angle second safety zone calculator 84 assumes a power distribution of the laser beams L guided from the micromirrors 40 to the substrate F with a Gaussian distribution, and sets, as shown in FIG. 14, image data for recording a plurality of straight lines 92 of constant width extending parallel to the Y direction at different positions spaced along the X direction, and image data for recording a single straight line 94 extending parallel to the X direction. Then, the inclined angle second safety zone calculator 84 sets a threshold value for an accumulated power value to cause the straight line 94 to have a given line width, calculates an accumulated power distribution of the laser beams L at the time the straight lines 92 are recorded based on the image data for each value of the inclined angle θ, and determines the line width LW(X) of each of the straight lines 92 by comparing the accumulated power value with the threshold value. The inclined angle second safety zone calculator 84 calculates the line width variation range LWV(θ) from the differential data between the maximum and minimum values of the line width LW(X). Instead of setting the image data for the straight lines 92 to calculate the line width variation range LWV(θ), the inclined angle second safety zone calculator 84 may determine line widths LW(X) by shifting the positional relationship between image data for one straight line 92 and the micromirrors 40 of the DMD 36 by a small quantity in the X direction, and then calculate each line width variation range LWV(θ).

A graph indicated by the solid lines in FIG. 13 represents a simulated conceptual characteristic curve plotted with respect to a horizontal axis representative of the inclined angle θ and a vertical axis representative of the line width variation range LWV(θ). Since the power distribution of the laser beams L is set as a Gaussian distribution, the line width variation range LWV(θ) is of values greater than the characteristic curve of the maximum value ΔX_max(θ). Since the line width variation range LWV(θ) is calculated in the range of the first safety zone R1(θ) in which the maximum value ΔX_max(θ) is equal to or smaller than the threshold value TH_LWV, the time required for the simulation is shortened.

The inclined angle second safety zone calculator 84 then compares the line width variation range LWV(θ) with the threshold value TH_LWV, and calculates the second safety zone R2(θ) for allowable inclined angles θ that are equal to or lower than the threshold value TH_LWV (step S5). As with the first safety zone R1(θ), the second safety zone R2(θ) represents a range in which changes in the line width variation range LWV(θ) are small and the inclined angles θ are successive, and which satisfies the condition: LWV(θ)≦TH_LWV.

The inclined angle θi (see FIG. 9) of each of the swaths Si, which represent columns of micromirrors 40 arrayed in the Y direction, may differ from swath Si to swath Si due to manufacturing errors of the DMD 36 and the effects of the optical system made up of the exposure heads 24a through 24j.

After the slit plate 73 on the exposure stage 18 is moved to a position below the exposure heads 24a through 24j, the laser beams L are guided to the slit plate 73 via the micromirrors 40 of the DMD 36, passed through the slit sections 75a, 75b defined in the slit plate 73, and detected by the photosensor 69. Based on the positional information in the X direction of the photosensor 69 and the positional information in the Y direction of the exposure stage 18, which is obtained from the encoder 81, the positions of the micromirrors 40 making up the swaths Si are calculated, and the inclined angles θi of the respective swaths Si are calculated from the calculated positions. The difference between the maximum and minimum values of the inclined angles θi are calculated as a fluctuation interval Δθ of the inclined angles θi of the swaths Si of the DMD 36 (step S6).

Then, the inclined angle setting unit 86 selects and sets an inclined angle θ which allows the range of the fluctuation interval Δθ, from the second safety zone R2(θ) determined by the inclined angle second safety zone calculator 84 (step S7). By thus setting the inclined angle θ, line width variations in the X direction of the image pattern extending in the Y direction are kept within an allowable range given as the line width variation range LWV(θ) over the full range of the DMD 36.

The inclined angle θ should desirably be selected from a range in which variations of the line width variation range LWV(θ) calculated by the simulation in step S4 are small. Alternatively, a weighting coefficient that is greater as the line width variation range LWV(θ) is smaller may be assigned to the line width variation range LWV(θ), and the inclined angle θ may be selected preferentially from a range of large weighting coefficients.

As shown in FIG. 13, if there are a plurality of second safety zones R2(θ), then one of the second safety zones R2(θ) in which the inclined angle θ is greater and the degree of multiplicity for multiple exposure is greater may desirably be selected preferentially.

Figure 15:
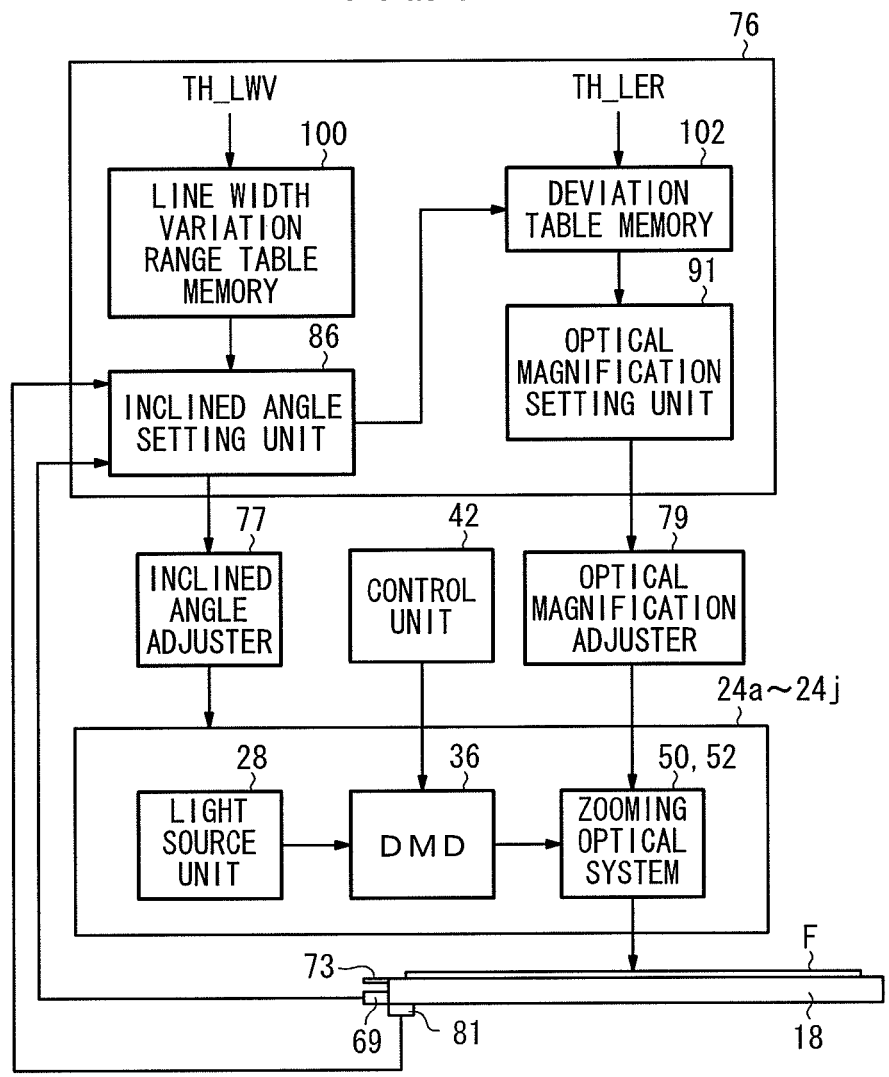
FIG. 15 is a block diagram of a control circuit according to another embodiment.

Furthermore, as shown in FIG. 15, the line width variation range LWV(θ) (representing the relationship shown by the solid-line curve in FIG. 13) calculated by the simulation in step S4 may be stored as a line width variation range table in a line width variation range table memory 100, and when the exposure apparatus 10 is serviced for maintenance, for example, the measured inclined angle θ may be changed to an appropriate inclined angle θ within the range of the second safety zone R2(θ) of the line width variation range LWV(θ) that is read from the line width variation range table memory 100 according to the desired threshold value TH_LWV.

FIG. 9 shows a degree 2 or 3 of multiplicity with two or three micromirrors 40 on a scanning line 57. If a plurality of micromirrors 40 are arrayed on one scanning line 57 and no micromirror is disposed between adjacent scanning lines 57, then the line width variation range LWV(θ) is large because of the gap between scanning lines 57.

In order to reduce the line width variation range LWV(θ), the inclined angle θ is set such that recording points produced by multiple exposure are equally disposed between the scanning lines 57.

Figure 16:
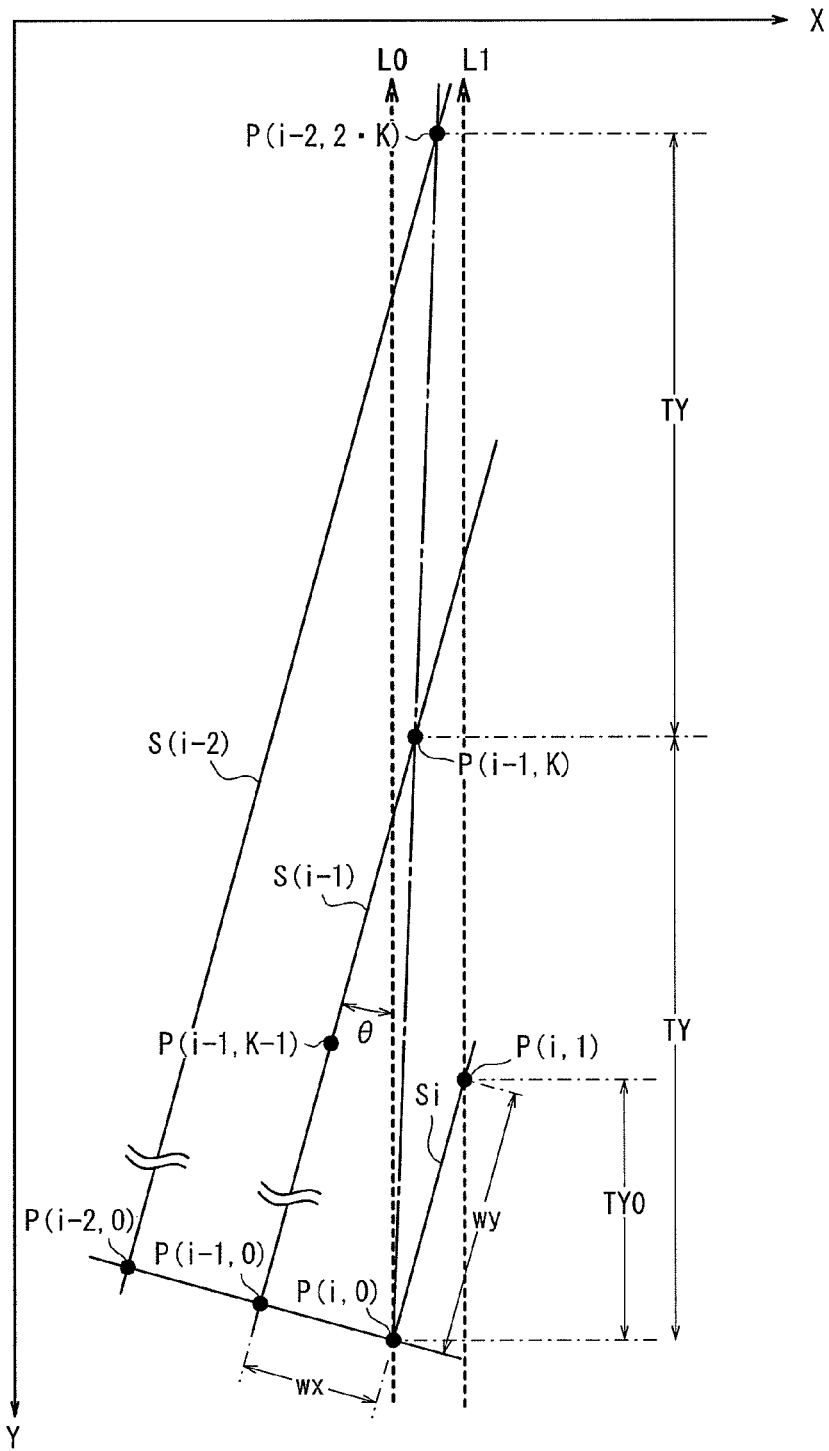
FIG. 16 is a diagram showing the layout of mirror images on the substrate of the DMD of the exposure apparatus according to the embodiment.
Figure 17:
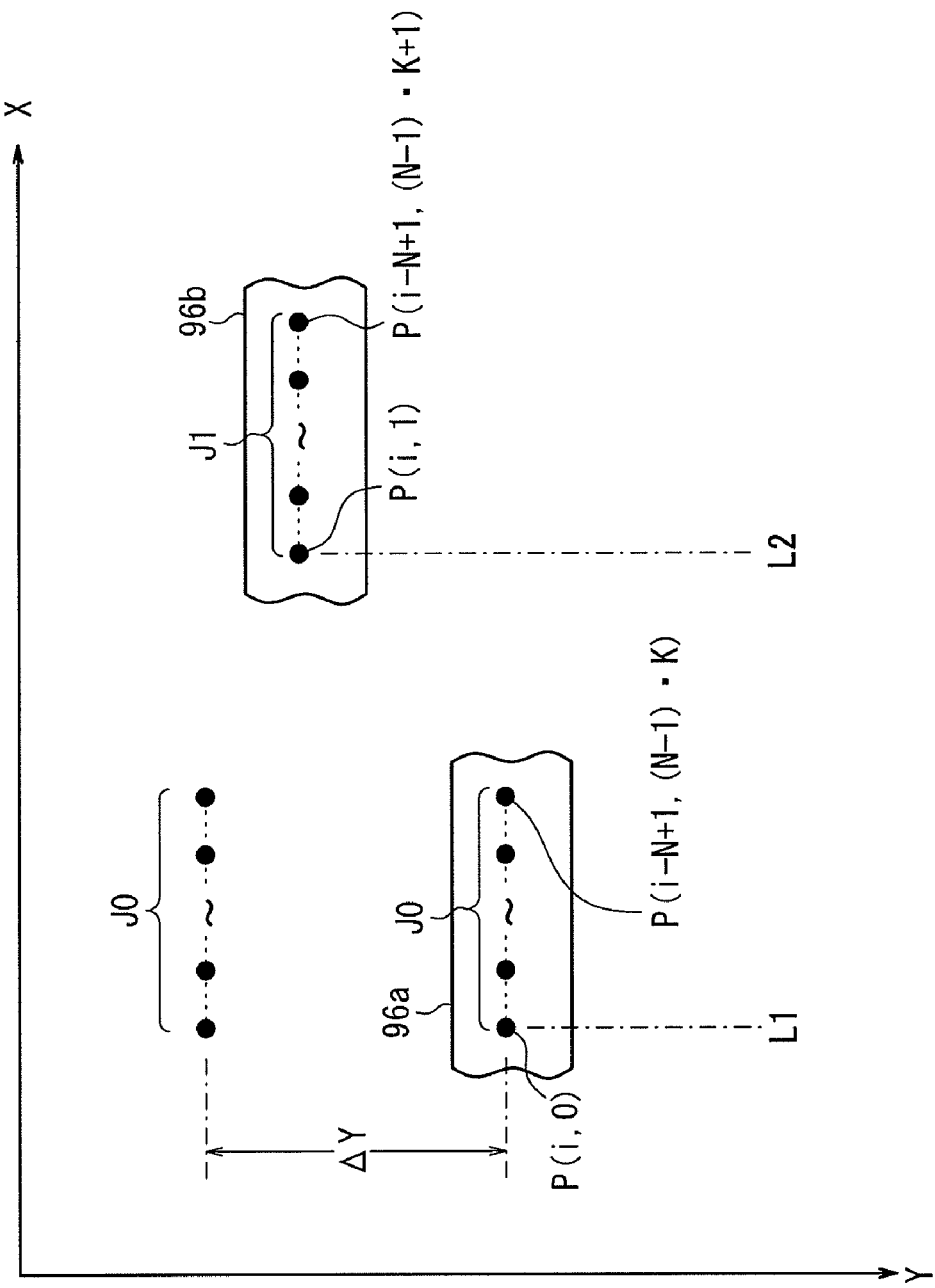
FIG. 17 is a diagram showing the layout of recording points recorded on the substrate by the DMD of the exposure apparatus according to the embodiment.

FIG. 16 shows the layout of mirror images P(i,k) produced when micromirrors 40 at positions (i,k) shown in FIG. 9 are projected onto the substrate F. FIG. 17 shows the layout of recording points recorded on the substrate F at a recording pitch ΔY in the Y direction by the exposure apparatus 10. A group J0 includes recording points recorded by mirror images P(i, 0), P(i−1,K), P(i−2,2·K), ... P(i−N+1, (N−1)·K) based on the degree N of multiplicity. A group J1 includes recording points recorded by adjacent mirror images P(i,1), P(i−1,K+1), P(i−2,2·K+1), P(i−N+1, (N−1)·K+1). Recording points recorded by mirror images P(i,k) are indicated by P(i,k) for illustrative purposes.

If the positions of the X coordinates of N mirror images P(i,0), P(i−1,K), P(i−2,2·K), ... P(1−N+1, (N−1)·K) based on the degree N of multiplicity which were arrayed on a straight line L0 passing through the mirror image P(i,0) and extending parallel to the Y direction, are disposed equally between the straight line L0 and a straight line L1 passing through a mirror image P(i,1) and extending parallel to the straight line L0, then the line width variation range LWV(θ) due to the gap between the straight lines L0, L1 is reduced. In other words, the inclined angle θ may be set to locate the mirror images P(i,k) at respective positions at which the space between the straight lines L0, L1i is divided into q/N segments (q: an integer including 1, not having a common divisor with N, and smaller than N).

The inclined angle adjuster 77 rotates the exposure heads 24a through 24j to achieve to the inclined angle θ thus set (step S8).

It is assumed that an image is produced by way of multiple exposure using a plurality of micromirrors 40, and, for example, the recording points of the groups J0, J1 are arrayed in a column in the X direction, as shown in FIG. 17. When a straight line along the column of these recording points or a straight line slightly oblique to the column of these recording points is recorded, straight line patterns 96a, 96b separated in a direction perpendicular to the column of the recording points may possibly be produced. If the group J0 and the group J1 are arrayed in a column in the X direction, then straight lines separated at a period longer than when the recording points of the groups J0, J1 are arrayed in the column may possibly be produced. When the recording points are arrayed in the X direction, therefore, jaggies are produced as the image pattern to be recorded is separated in the Y direction.

According to the present embodiment, the optical magnification β of the micromirrors 40 with respect to the substrate F is adjusted to adjust the layout in the Y direction of the recording points of the groups J0, J1 for thereby solving the above problem.

For adjusting the optical magnification β, a condition for arraying the recording points of the group J0 and the recording points of the group J1 in the X direction is first determined. The condition is the same as a condition for arraying the recording points recorded on the substrate F by the adjacent micromirrors 40 on the same swath Si, in the X direction, and corresponds in FIG. 17 to a condition for arraying the recording points produced by the mirror image P(i,0) and the recording points produced by the mirror image P(i,1) in the X direction.

If it is assumed that the distance between the mirror images P(i,0), P(i,1) in the direction of swath columns on the substrate F (in the direction of a straight line interconnecting the mirror images P(i,0), P(i,1)) is represented by wy, the optical magnification by βt1, and the distance between adjacent micromirrors 40 in the direction of swath columns, then the distance TY0 (see FIG. 16) between the mirror images P(i,0), P(i,1) in the Y direction is expressed as:

$$TY0 = wy \cdot \cos\theta = \beta t1 \cdot dy \cdot \cos\theta \quad (1)$$

If it is assumed that the recording pitch in the Y direction of the recording points produced by the exposure apparatus 10 is represented by ΔY and H denotes an integer, then the condition for arraying the recording points produced by the mirror images P(i,0), P(i,1) in the X direction is given as:

$$TY0 = H \cdot \Delta Y \quad (2)$$

From the equations (1), (2), when the optical magnification βt1 is expressed by:

$$\beta t1 = \Delta Y \cdot H / (dy \cdot \cos\theta) \quad (3)$$

the recording points produced by the mirror images P(i,0), P(i,1) are arrayed in the X direction.

The optical magnification first safety zone calculator 88 puts the inclined angle θ set by the inclined angle setting unit 86, into the equation (3) to calculate the optical magnification βt1, and calculates a first safety zone Q1(β) for allowable optical magnifications β avoiding an optical magnification α1 in a range of values in the vicinity of the optical magnification βt1 (step S9).

Figure 18:
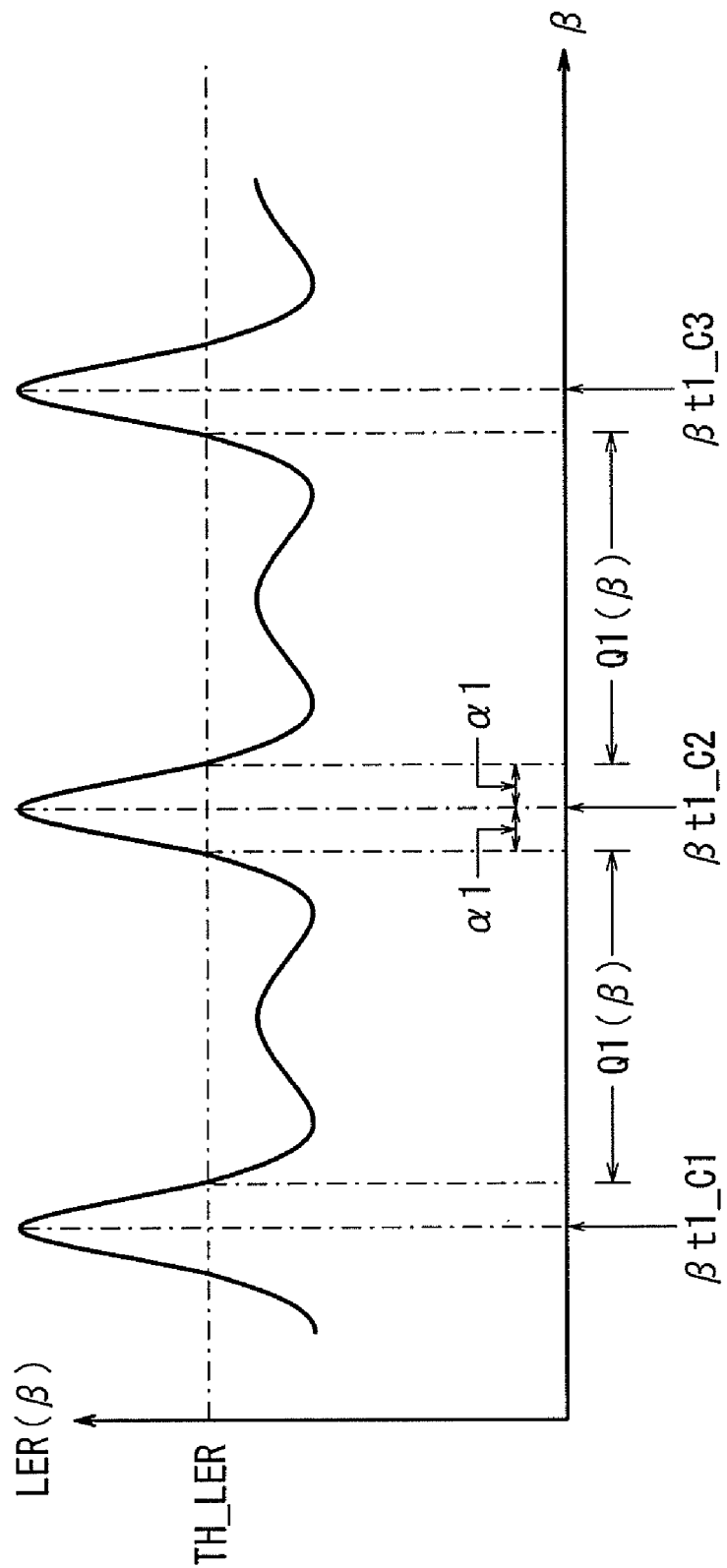
FIG. 18 is a diagram showing the relationship between the optical magnification of DMD mirror images with respect to the substrate and the deviation of the positions of recording points recorded by adjacent mirror images in the exposure apparatus according to the embodiment.

FIG. 18 shows a simulated conceptual characteristic curve plotted to represent the relationship between the optical magnification β having a long period and a deviation LER(β) of a straight line in the Y direction (βt1_C1, βt1_C2, βt1_C3 represent different optical magnifications βt1). The first safety zone Q1(β) is set to a range in which the deviation LER(β) is equal to or smaller than a threshold value TH_LER serving as an allowable upper limit value.

Then, a condition for arraying adjacent recording points of the groups J0, J1, e.g., a recording point produced by the mirror image P(i,0) and a recording point produced by the mirror image P(i−1,K), in the X direction will be determined.

As shown in FIG. 16, a straight line interconnecting the mirror image P(i,0) and the mirror image P(i−1,K) is inclined a given angle to the Y direction in order to reduce the line width variation range LWV(θ) in the X direction. A gradient tK of the straight line is defined as:

$$tK = (wx/wy) \cdot (1/\tan\theta) \quad (4)$$

where wx represents the distance between the mirror images P(i,0), P(i−1,0) in the direction of swath columns on the substrate F (in the direction of a straight line interconnecting the mirror images P(i,0), P(i−1,0)). With K0=INT(tK) (INT: an integer part of tK), the inclined angle θ is categorized into three angle classifications. For example, if the degree N of multiplicity is N=8, then the angle classifications are given as the following three cases:

<Case 1>
If (K0+⅔)≦tK<(K0+1), then K=K0+1, stp=1
<Case 2>
If (K0+⅓)≦tK<(K0+⅔), then K=stp·K0+1, stp=2
<Case 3>
If K0≦tK<(K0+⅓), then K=K0, stp=1

The angle classifications are not limited to the above three cases, but may be optimum angle classifications depending on the degree N of multiplicity and the results of the simulation. If the number of recording points arrayed successively in the X direction increases (it becomes greater as the degree of multiplicity is higher), then the deviation LER(θ) increases. Therefore, the angle classifications should desirably be set depending on the number of recording points. For adjusting the number of recording points, the number Valid of rows of micromirrors 40 effective for image recording is determined by:

$$\text{Valid} = Ynum - INT(Ynum - tK \cdot N) \quad (5)$$

where Ynum represents the number of all rows in the Y direction of the micromirrors 40 of the DMD 36, and the other micromirrors 40 should preferably be turned off at all times as shown hatched in FIG. 9.

The distance TY (see FIG. 16) in the Y direction between the mirror images P(i,0), P(i−1,K) is given as:

$$TY = \beta t2 \cdot (K \cdot dy \cdot \cos\theta + d \cdot stp \cdot \sin\theta) \quad (6)$$

where βt2 represents an optical magnification. The condition for arraying recording points produced by the mirror images P(i,0), P(i−1,K) in the X direction is given as:

$$TY = \Delta Y \cdot M \quad (7)$$

where M represents an integer.

From the equations (6), (7), when the optical magnification βt2 is expressed by:

$$\beta t2 = \Delta Y \cdot M / (K \cdot dy \cdot \cos\theta + dx \cdot stp \cdot \sin\theta) \quad (8)$$

the recording points produced by the mirror images P(i,0), P(i−1,K) are arrayed in the X direction. The inclined angle θ is positive clockwise (θ>0 in FIG. 16).

The optical magnification second safety zone calculator 90 selects the case of the corresponding angle classification from the inclined angle θ set by the inclined angle setting unit 86, determines the values of K and stp, and puts the inclined angle θ into the equation (8) to calculate the optical magnification βt2. The optical magnification second safety zone calculator 90 then calculates a second safety zone Q2(β) for allowable optical magnifications exclusive of optical magnifications ±α2 in a given range in the vicinity of the optical magnification βt2 (step S10).

Figure 19:
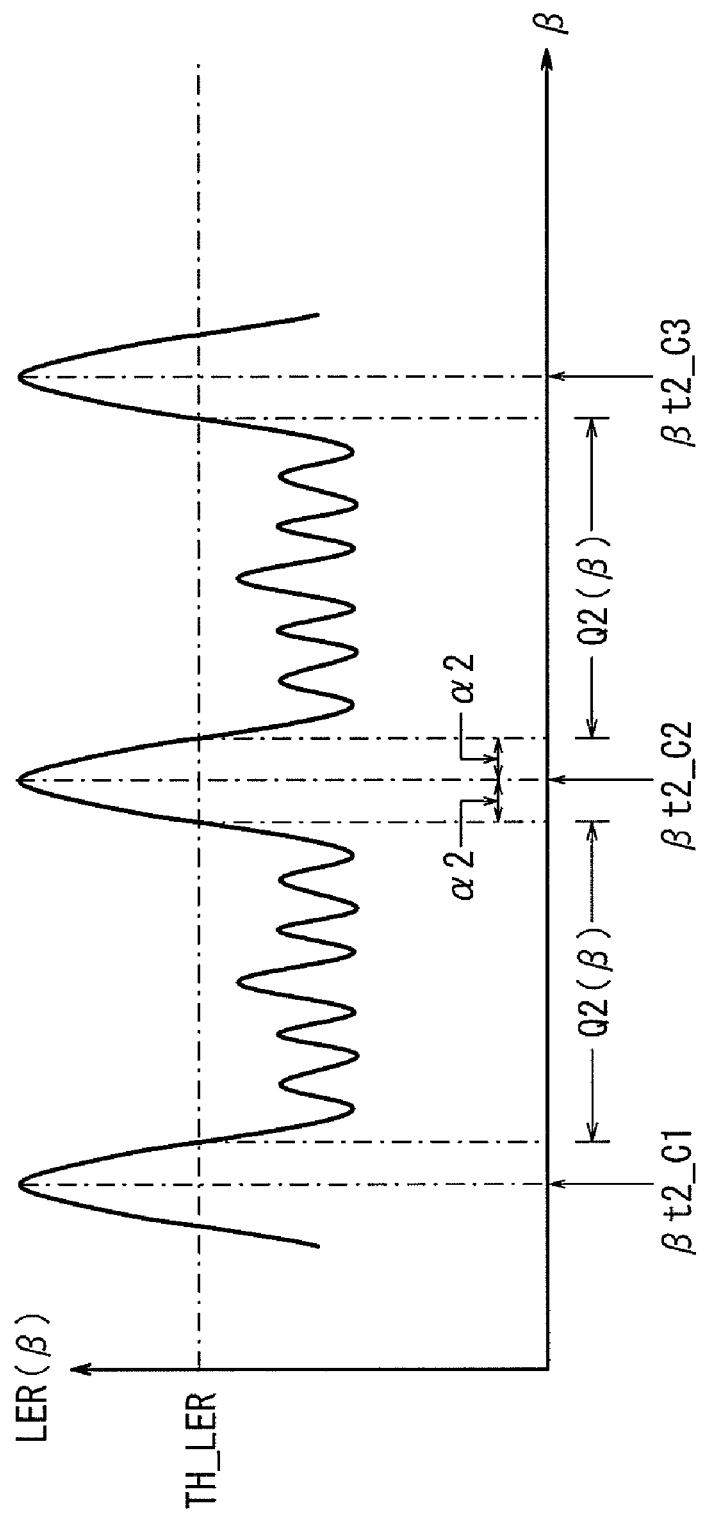
FIG. 19 is a diagram showing the relationship between the optical magnification of DMD mirror images with respect to the substrate and the deviation of the positions of adjacent recording points recorded in the exposure apparatus according to the embodiment.

FIG. 19 shows a simulated conceptual characteristic curve plotted to represent the relationship between optical magnification β having a short period in the first safety zone Q1(β) and a deviation LER(β) of a straight line in the Y direction (βt2_C1, βt2_C2, βt2_C3 represent different optical magnifications βt2). The second safety zone Q2(β) is set to a range in which the deviation LER(β) is equal to or smaller than a threshold value TH_LER serving as an allowable upper limit value.

Then, the optical magnification setting unit 91 sets an optical magnification β in the second safety zone Q2(β) determined by the optical magnification second safety zone calculator 90 (step S11). In view of the accuracy with which the exposure apparatus 10 is installed and variations of the exposure apparatus 10, the optical magnification p should preferably be set to an intermediate value of the second safety zone Q2(β). Furthermore, in order to have the recording points positionally distributed in the Y direction within the groups J0, J1 shown in FIG. 17, the optical magnification β should preferably be set to satisfy the relationship expressed by, for example:

$$TY = \Delta Y \cdot M + q \cdot \Delta Y/N' \quad (9)$$

where q represents an integer including 1, but not mod(N', q) ≠0, and smaller than N', and N' the number of recording points in the groups J0, J1 arrayed in the X direction. In the above-described <Case 1> or <Case 3>, N'=N (the degree of multiplicity), and in the above-described <Case 2>, N'=N/2.

By thus setting the optical magnification β, jaggies representing shifts in the Y direction of the image pattern extending in the X direction are held in an allowable range represented by the deviation LER(β).

Alternatively, the optical magnification β can be determined by a simulation in substantially the same manner as with step S4 according to the inclined angle θ set by the inclined angle setting unit 86 or the inclined angle θ in the second safety zone Q2(β) which is calculated by the inclined angle second safety zone calculator 84.

For example, a power distribution of the laser beams L is assumed with a Gaussian distribution, and an accumulated power distribution of the laser beams L for recording a straight line on the substrate F based on image data for producing the straight line parallel to the X direction is calculated for each value of the optical magnification β. The accumulated power distribution is compared with a given threshold value to determine a recorded position in the Y direction of the straight line, and a deviation LER(β) of the recorded position is calculated. FIGS. 18 and 19 show the results of such a simulation. This process is carried out for each value of the inclined angle θ set by the inclined angle setting unit 86 or the inclined angle θ in the second safety zone R2(θ) which is calculated by the inclined angle second safety zone calculator 84. An optical magnification β is determined such that the deviation LER(β) is equal to or smaller than the threshold value TH_LER.

In view of the accuracy and variations of the exposure apparatus 10, the optical magnification β should preferably be set as an intermediate value of the second safety zone Q2(β). The optical magnification β may alternatively be set to a value for minimizing changes of the deviation LER(β) in the second safety zone Q2(β).

Furthermore, as shown in FIG. 15, the deviation LER(β) (representing the relationship shown in FIG. 19) calculated by the simulation may be stored as a deviation table for each inclined angle θ, in a deviation table memory 102, and when the exposure apparatus 10 is serviced for maintenance, for example, an appropriate optical magnification β may be set within the range of the second safety zone Q2(β) of the deviation LER(β) that is read from the deviation table memory 102 according to the desired threshold value TH_LER and the inclined angle θ.

Based on the optical magnification β thus set, the optical magnification adjuster 79 displaces the second image focusing optical lenses 50, 52 to adjust the optical magnification β (step S12).

Instead of adjusting the optical magnification β or in addition to adjusting the optical magnification β, the recording pitch ΔY may be adjusted to distribute the positions of the recording points in the Y direction to reduce the deviation of the straight line that extends in the X direction.

Figure 20:
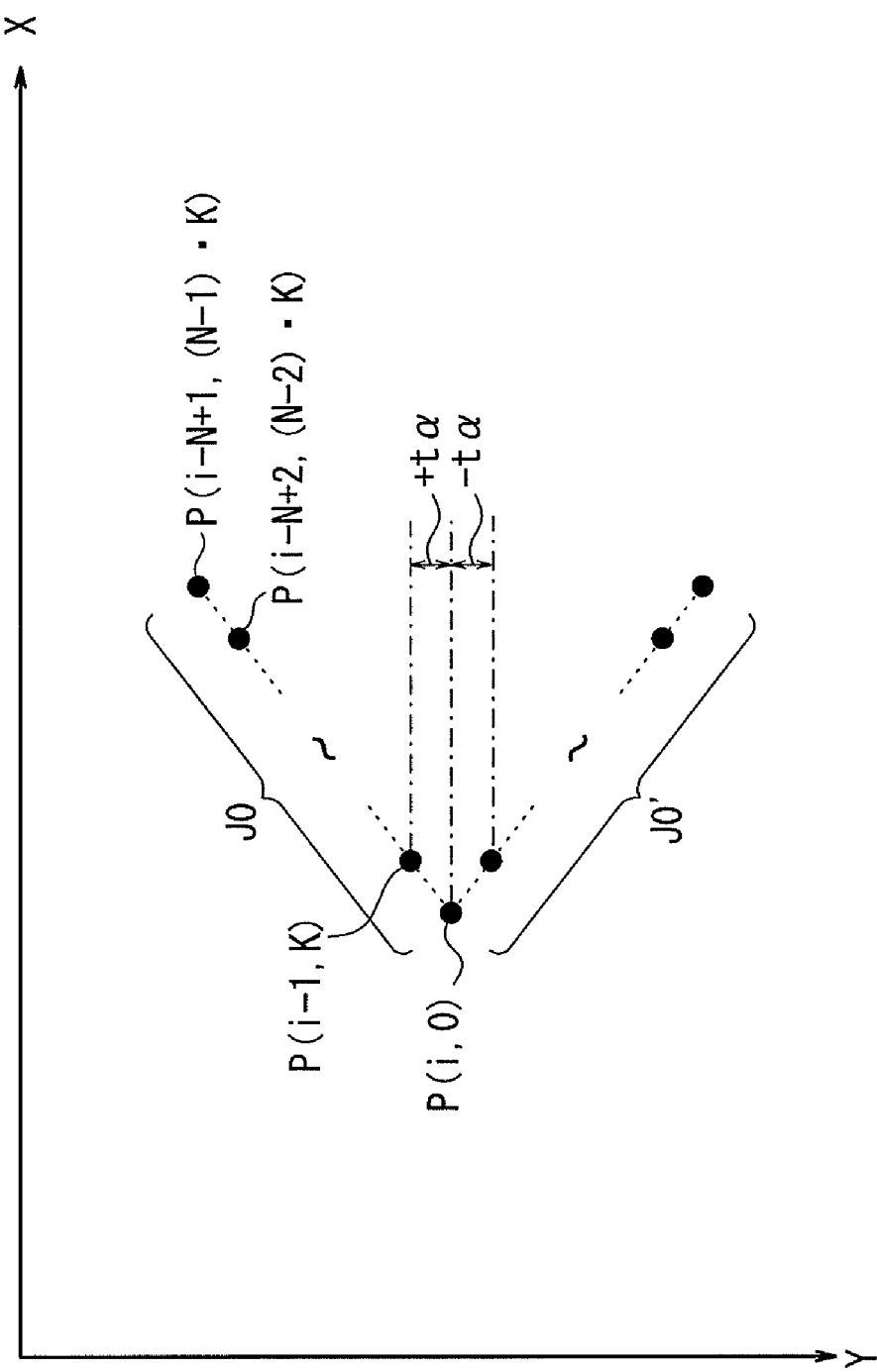
FIG. 20 is a diagram showing a process of adjusting a recording pitch with the exposure head of the exposure apparatus according to the embodiment.

Specifically, at the recording pitch ΔY which satisfies the condition according to the equation (7), the recording points are arrayed horizontally in the X direction, as shown in FIG. 17, resulting in an increase in the deviation. LER(β). As shown in FIG. 20, a given range ±tα is set in the vicinity of the recording pitch ΔY in association with the optical magnification ±α2 in the vicinity of the optical magnification βt2 calculated in step S10, and a safety zone for the recording pitch ΔY is set as a range exclusive of the given range ±tα.

A condition for placing the recording pitch ΔY in the given range ±tα is expressed as:

$$-t\alpha \leq (TY - \Delta Y \cdot M) \leq t\alpha (t\alpha \geq 0) \quad (10)$$

where M represents the number of recording steps of recording points recorded between the mirror images P(i,0), P(i−1, K). If a minimum number M0 of steps for the number M of recording steps that can be set is fixed, then the recording points of the group J0 or J0' are recorded in the range exclusive of the given range ±tα by setting the recording pitch ΔY from which the condition of the equation (10) is excluded at the time M=M0. The deviations in the Y direction of the straight line extending in the X direction are thus prevented from increasing.

In order for recording points produced by mirror images P(i,0), P(i−1,K), . . . , P(i−N+1, (N−1)·K) shown in FIG. 20 to be distributed equally in the Y direction in the group J0, the recording pitch ΔY may be set as:

$$\Delta Y = TY/(M0 - p/N') \quad (11)$$

where p represents an integer including 1, but not mod(N',p)≠ 0, and smaller than N', and N' the number of recording points in the group J0 arrayed in the X direction. In the <Case 1> or <Case 3>, N'=N (the degree of multiplicity), and in the <Case 2>, N'=N/2.

The recording pitch ΔY is a parameter affecting the productivity of the substrate F and may not be changed greatly. In such a case, the number M of recording steps may be increased or reduced according to the equation (10), rather than adjusting the recording pitch ΔY. The recording pitch ΔY or the number M of recording steps can be adjusted by the timing to reset the image data supplied to the DMD 36 or the speed at which the exposure stage 18 is fed.

Furthermore, rather than adjusting the optical magnification β, the recording pitch ΔY, or the number M of recording steps, the inclined angle θ in the second safety zone R2(θ) calculated by the inclined angle second safety zone calculator 84 may be finely adjusted in a range which does not satisfy the condition of the equation (8), for thereby reducing the deviation of the straight line extending in the X direction.

Figure 21:
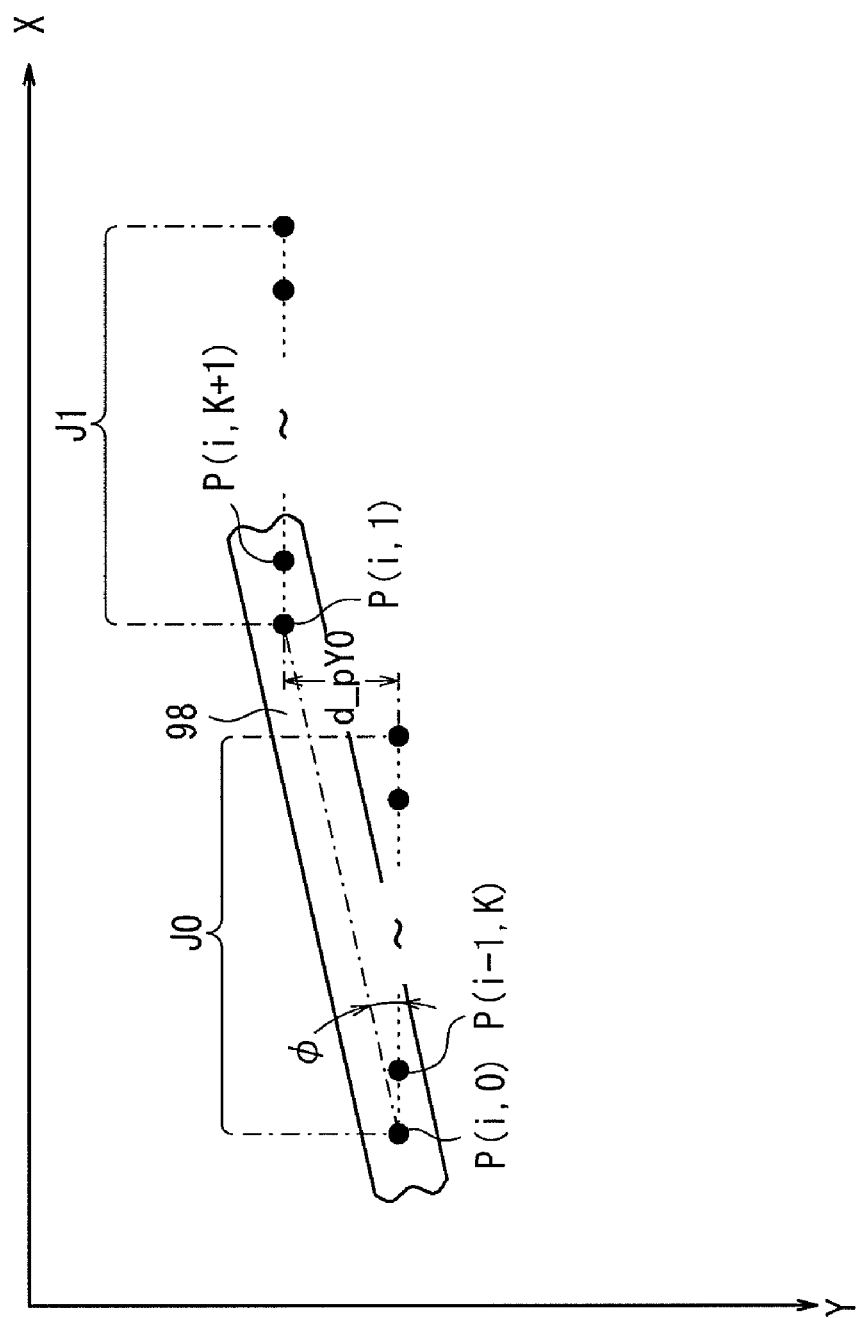
FIG. 21 is a diagram showing an adjusting process in a case a recorded straight-line pattern is inclined to a scanning direction.
Figure 22:
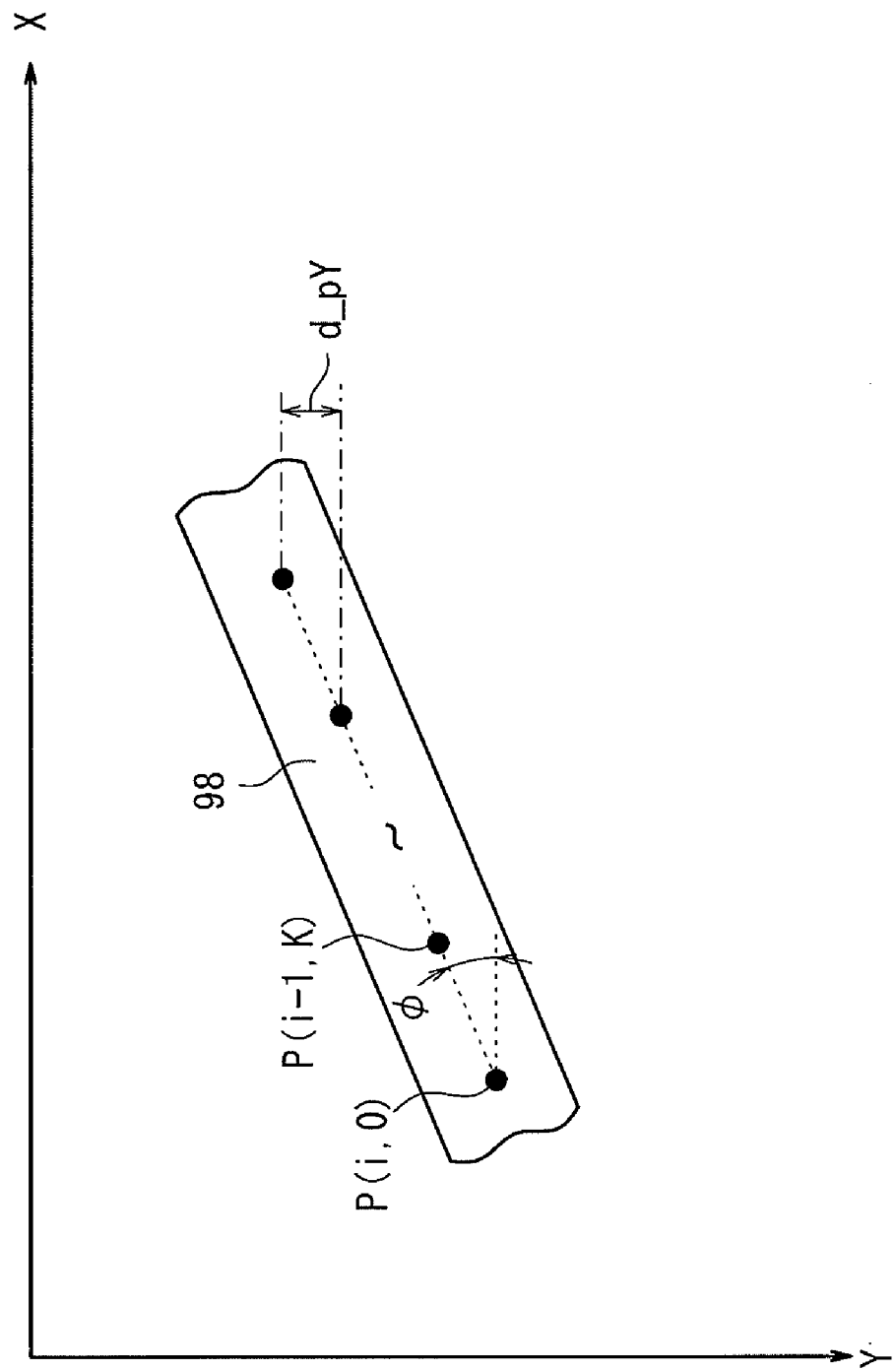
FIG. 22 is a diagram showing an adjusting process in a case a recorded straight-line pattern is inclined to a scanning direction.

The adjusting process for reducing the deviation in the Y direction at the time the straight line patterns 96a, 96b are parallel to the X direction has been described above. As shown in FIGS. 21 and 22, if a straight line pattern 98 is inclined an inclined angle φ(≠0) to the X direction, then the first safety zone Q1(β) and the second safety zone Q2(β) should preferably be adjusted as follows:

A condition for arraying a straight line interconnecting recording points recorded based on the mirror images P(i,0), P(i,1) in the same direction as the straight line pattern 98 is to satisfy an optical magnification β1 given as:

$$\beta 1 = \Delta Y \cdot H / (dy \cdot (\cos \theta + \sin \theta \cdot \tan \phi)) \quad (12)$$

as shown in FIGS. 16 and 21, in substantially the same manner as with the equation (3). The inclined angle is positive clockwise (φ<0 in FIG. 21). H represents an integer satisfying the relationship:

$$wy \cdot \cos \theta + d\_pY0 = H \cdot \Delta Y \quad (13)$$

where d_pY0 represents the distance in the Y direction between the mirror images P(i,0), P(i,1).

By setting the range of the optical magnification β exclusive of a given range in the vicinity of the optical magnification β1 according to the equation (12), as the first safety zone Q1(β), jaggies generated in the Y direction when the image recording points generated by the mirror images P(i,0), P(i,1) are inclined in substantially the same direction as the straight line pattern 98 having the inclined angle φ are prevented from occurring.

A condition for arraying a straight line interconnecting recording points recorded based on the mirror images P(i,0), P(i−1,K) in the same direction as the straight line pattern 98 is to satisfy an optical magnification β2 given as:

$$\beta 2 = \Delta Y \cdot M / (K \cdot dy \cdot \cos \theta + dx \cdot stp \cdot \sin \theta + (K \cdot dy \cdot \sin \theta - dx \cdot stp \cdot \cos \theta) \cdot \tan \phi) \quad (14)$$

as shown in FIGS. 16 and 22, in substantially the same manner as with the equation (8). M represents an integer satisfying the relationship:

$$TY + d\_pY = M \cdot \Delta Y \quad (15)$$

where d_pY represents the distance in the Y direction between the mirror images P(i,0), P(i−1,K). stp represents a number defined by the angle classification of the inclined angle θ, e.g., a number defined by <Case 1> through <Case 3> in case the degree N of multiplicity is N=8.

By setting the range of the optical magnification β exclusive of a given range in the vicinity of the optical magnification β2 according to the equation (14), as the second safety zone Q2(β), jaggies generated in the Y direction when the image recording points generated by the mirror images P(i,0), P(i−1,K) are inclined in substantially the same direction as the straight line pattern 98 having the inclined angle φ are prevented from occurring.

For adjusting the positions of the recording points depending on the inclined angle φ of the straight line pattern 98 to be recorded, the recording pitch ΔY, the number M of recording steps, or the inclined angle θ, instead of the optical magnification β, may be adjusted depending on the inclined angle φ of the straight line pattern 98.

An evaluating process for optimally setting the parameter of the optical magnification β, the recording pitch ΔY, the number M of recording steps, or the inclined angle θ as described above will be described by way of example below.

Figure 23:
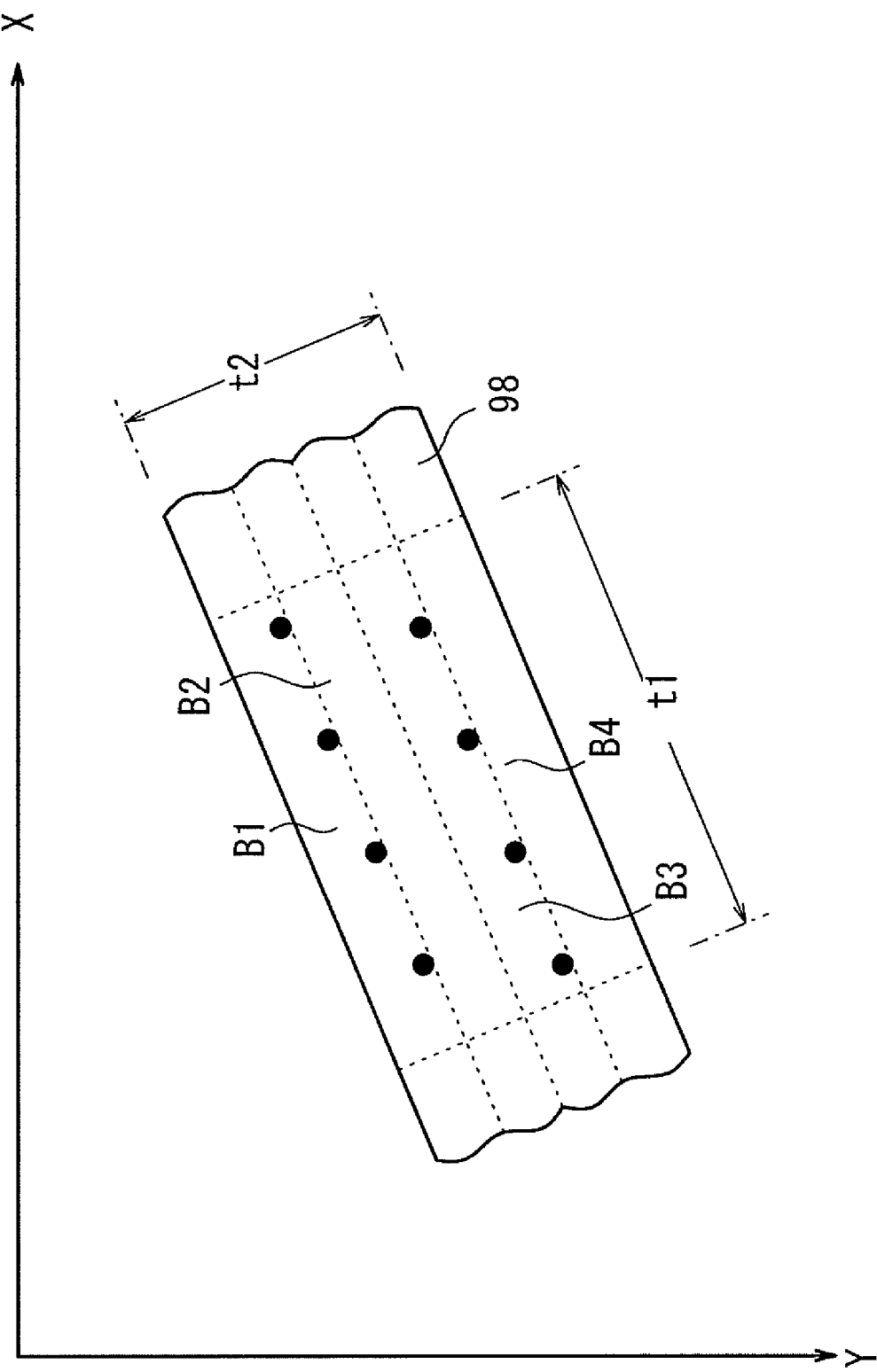
FIG. 23 is a diagram showing a process of evaluating parameters adjusted in the exposure apparatus according to the embodiment.
Figure 24:
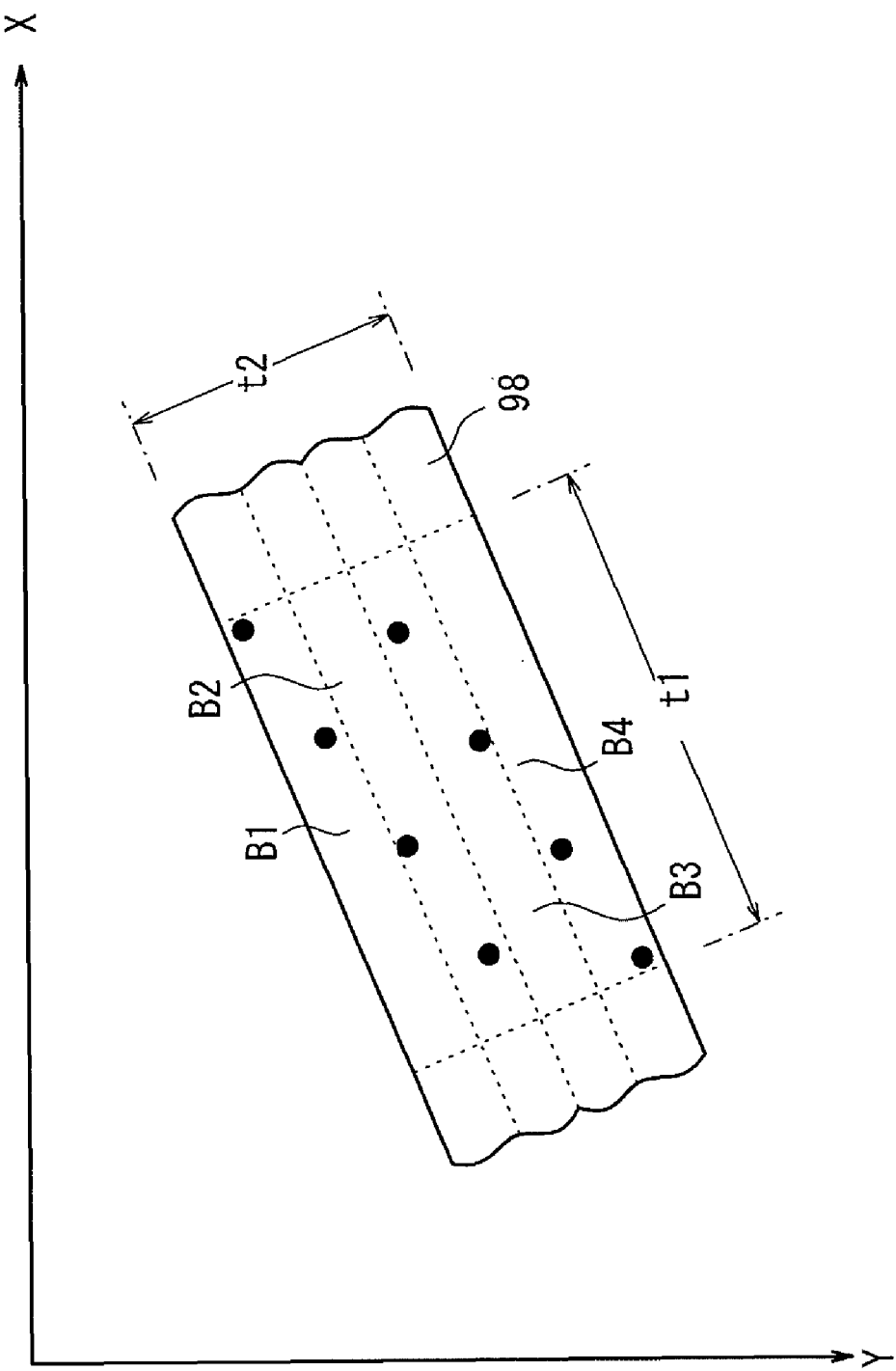
FIG. 24 is a diagram showing a process of evaluating parameters adjusted in the exposure apparatus according to the embodiment.

As shown in FIG. 23, a size in the direction in which a straight line pattern 98 to be recorded extends is represented by t1, and a size in a direction perpendicular to the direction in which the straight line pattern 98 to be recorded extends is represented by t2. The straight line pattern 98 is divided into a plurality of blocks B1 through Bs in the direction of the size t2, and the numbers cnt(B1) through cnt(Bs) of recording points (indicated by solid dots) in the blocks B1 through Bs are counted. A maximum value of the counts is represented by max(cnt(B1), ... , cnt(Bs)), and a minimum value of the counts by min(cnt(B1), ... , cnt(Bs)). The distribution degree D of the recording points is calculated as:

$$D = \max(cnt(B1), \ldots, cnt(Bs)) - \min(cnt(B1), \ldots, cnt(Bs)) \quad (16)$$

to evaluate the parameter. In the layout shown in FIG. 23, the distribution degree D is D=4. In the layout shown in FIG. 24, the distribution degree D is D=0. It is thus judged that the parameter should preferably be set to achieve the layout shown in FIG. 24.

The inclined angle φ of the straight line pattern 98 recorded on the substrate F is not necessarily only one angle. However, there may be a mixture of straight line patterns 98 having respective inclined angles φ. In such a case, the parameter such as the optical magnification β or the like is set from a common range of second safety zones Q2(β) calculated with respect to the respective inclined angles φ of those straight line patterns 98. If such a common range cannot be found, then the parameter such as the optical magnification β or the like is set such that the maximum value of the distribution degrees D calculated for the respective straight line patterns 98 is equal to or smaller than a predetermined value.

After the inclined angle θ, the optical magnification β, the recording pitch ΔY, or the number M of recording steps is adjusted, the substrate F is exposed to a desired image. The recording pitch ΔY or the number M of recording steps can be adjusted by the control unit 42.

After the substrate F is attracted to and held by the exposure stage 18, the control unit 42 actuates the exposure stage 18 to move in one direction along the guide rails 16 on the bed 14. When the exposure stage 18 passes through the column 20, the CCD cameras 22a, 22b read alignment marks placed in given positions on the substrate F. The control unit 42 calculates position correcting data for the substrate F based on the positional data of the alignment marks that are read.

After calculating the position correcting data, the control unit 42 moves the exposure stage 18 in the other direction, and controls the scanner 26 to start recording an image on the substrate F by way of exposure.

Specifically, the laser beam L output from the light source unit 28 is guided through the optical fiber 30 and introduced into the exposure heads 24a through 24j. The introduced laser beam L is then applied via the rod lens 32 and the reflecting mirror 34 to the DMD 36.

The micromirrors 40 of the DMD 36 are selectively turned on and off according to image recording data. As shown in FIGS. 4 and 5, the laser beam L selectively reflected in a desired direction by each of the micromirrors 40 is magnified by the first image focusing optical lenses 44, 46, adjusted to a predetermined diameter by the microaperture array 54, the microlens array 48, and the microaperture array 56, then adjusted to a predetermined magnification by the second image focusing optical lenses 50, 52, and led to the substrate F.

The exposure stage 18 moves along the bed 14, during which time a desired two-dimensional image is recorded on the substrate F by the exposure heads 24a through 24j that are arrayed in the direction perpendicular to the moving direction of the exposure stage 18.

A transmissive spatial light modulator such as LCD or the like may be used instead of the DMD 36 which is a reflective spatial light modulator. For example, an MEMS (Micro Electro-Mechanical Systems) spatial light modulator, or a spatial light modulator other than the MEMS type, such as an optical device (PLZT device) for modulating transmitted light based on an electro-optical effect, or a liquid crystal shutter array such as a liquid crystal light shutter (FLC) or the like may be employed. The MEMS is a generic term representing integrated microsystems made up of microsize sensors, actuators, and control circuits fabricated by the micromachining technology based on the IC fabrication process. The MEMS spatial light modulator refers to a spatial light modulator that is actuated by electro-mechanical operation based on electrostatic forces, electromagnetic forces, or the like. A two-dimensional assembly of grating light valves (GLV) may also be employed. In the above arrangements, a lamp or the like, instead of a laser, may be employed as a light source.

In the above embodiment, the semiconductor lasers are used as the light source. However, a solid-state laser, an ultraviolet LD, an infrared LD, or the like may also be used as the light source. Furthermore, a light source having a two-dimensional array of light-emitting dots (e.g., an LD array, an LED array, or the like) may also be employed.

In the above embodiment, the exposure apparatus 10 is of a flat bed type. However, it may be an exposure apparatus of an outer drum type with a photosensitive medium wound around the outer circumferential surface of a drum or an exposure apparatus of an inner drum type with a photosensitive medium mounted on the inner circumferential surface of a drum.

The exposure apparatus 10 may appropriately be used to expose a dry film resist (DFR) and a liquid resist in a process of manufacturing a printed wiring board (PWB), to form a color filter in a process of manufacturing a liquid crystal display (LCD), to expose a DFR in a process of manufacturing a TFT, and to expose a DFR in a process of manufacturing a plasma display panel (PDP), etc., for example. The present invention may be applied to a substrate coated with a photosensitive material.

The exposure apparatus 10 described above may use either a photon-mode photosensitive material on which information is directly recorded by exposure or a heat-mode photosensitive material on which information is recorded with heat generated by exposure. If the photon-mode photosensitive material is employed, then a GaN semiconductor laser, a wavelength-conversion solid-state laser, or the like is used as the laser beam source. If the heat-mode photosensitive material is employed, then an infrared semiconductor laser, a solid-state laser, or the like is used as the laser beam source.

The arrangement of the present invention is not limited to the exposure apparatus, but may be applied to ink jet recording heads, for example. Specifically, ink jet recording heads generally have nozzles on a nozzle surface facing a recording medium (e.g., a recording sheet, an OHP sheet, or the like), for ejecting ink droplets. Some ink jet recording heads have a plurality of nozzles disposed in a grid pattern, and are tilted with respect to the scanning direction to record images of high resolution. In such ink jet recording heads with a two-dimensional array of nozzles, the parameters of the nozzles of the ink jet recording heads may be adjusted to prevent jaggies from being produced in images.

The invention claimed is:

1. A recording state adjusting method in a recording apparatus for relatively moving a two-dimensional array of image recording elements in a predetermined scanning direction along a recording surface and controlling the image recording elements according to image recording data to record an image on the recording surface, comprising:
    adjusting a recording magnification of recording points produced on the recording surface by the image recording elements to avoid arraying the recording points in substantially the same direction as a linear image pattern represented by the image recording data.

2. A recording state adjusting method according to claim 1, wherein the recording magnification is adjusted to avoid arraying the recording points produced on the recording surface by adjacent ones of the image recording elements in substantially the same direction as the linear image pattern.

3. A recording state adjusting method according to claim 1, wherein the recording magnification is adjusted to avoid arraying the recording points produced on the recording surface by the plurality of the image recording elements which record the recording points in identical or near positions on the recording surface, in substantially the same direction as the linear image pattern.

4. A recording state adjusting method according to claim 1, wherein after a safety zone for the recording magnification based on adjacent ones of the image recording elements is set, the recording magnification based on the plurality of the image recording elements which record the recording points in identical or near positions on the recording surface is adjusted in the safety zone.

5. A recording state adjusting device in a recording apparatus for relatively moving a two-dimensional array of image recording elements in a predetermined scanning direction along a recording surface and controlling the image recording elements according to image recording data to record an image on the recording surface, comprising:
    recording magnification adjusting means for adjusting a recording magnification of recording points produced on the recording surface by the image recording elements to avoid arraying the recording points in substantially the same direction as a linear image pattern represented by the image recording data.

6. A recording state adjusting device according to claim 5, wherein the recording magnification adjusting means adjusts the recording magnification of the recording points produced on the recording surface by adjacent ones of the image recording elements.

7. A recording state adjusting device according to claim 5, wherein the recording magnification adjusting means adjusts the recording magnification of the recording points produced in identical or near positions on the recording surface.

* * * * *